United States Patent
Kye et al.

(10) Patent No.: US 9,608,077 B1
(45) Date of Patent: Mar. 28, 2017

(54) SEMICONDUCTOR STRUCTURE AND METHOD FOR MANUFACTURING THE SAME

(71) Applicant: SK hynix Inc., Gyeonggi-do (KR)

(72) Inventors: Jeong-Seob Kye, Gyeonggi-do (KR);
Jae-Sung Kim, Gyeonggi-do (KR);
Tae-Kyum Kim, Gyeonggi-do (KR);
Kun-Young Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/048,236

(22) Filed: Feb. 19, 2016

(30) Foreign Application Priority Data

Sep. 4, 2015 (KR) .................. 10-2015-0125570

(51) Int. Cl.
| | | |
|---|---|---|
| H01L 21/82 | (2006.01) |
| H01L 29/40 | (2006.01) |
| H01L 29/45 | (2006.01) |
| H01L 21/02 | (2006.01) |
| H01L 21/283 | (2006.01) |
| H01L 21/306 | (2006.01) |
| H01L 21/768 | (2006.01) |
| H01L 29/66 | (2006.01) |

(52) U.S. Cl.
CPC ...... *H01L 29/401* (2013.01); *H01L 21/02425* (2013.01); *H01L 21/02532* (2013.01); *H01L 21/02694* (2013.01); *H01L 21/283* (2013.01); *H01L 21/30604* (2013.01); *H01L 21/7682* (2013.01); *H01L 29/456* (2013.01); *H01L 29/6656* (2013.01); *H01L 29/66636* (2013.01)

(58) Field of Classification Search
CPC .................. H01L 27/112; H01L 27/11266
See application file for complete search history.

(56) References Cited

U.S. PATENT DOCUMENTS

| | | | | |
|---|---|---|---|---|
| 7,573,132 B2* | 8/2009 | Chung | .............. | H01L 21/76814 257/748 |
| 8,344,517 B2* | 1/2013 | Kim | ..................... | H01L 21/7682 257/774 |
| 8,362,533 B2* | 1/2013 | Ozaki | ..................... | G11C 11/22 257/295 |
| 9,245,967 B2* | 1/2016 | Jung | ................. | H01L 21/28512 |

(Continued)

*Primary Examiner* — Zandra Smith
*Assistant Examiner* — Andre' C Stevenson
(74) *Attorney, Agent, or Firm* — IP & T Group LLP

(57) ABSTRACT

A method for manufacturing a semiconductor structure includes preparing a semiconductor substrate which includes a memory cell region and a peripheral circuit region; forming a buried word line in the semiconductor substrate in the memory cell region; forming a bit line structure over the semiconductor substrate in the memory cell region; forming a dielectric layer in the peripheral circuit region and the memory cell region; forming a first opening in the dielectric layer in the memory cell region; filling a silicon filler in the first opening; forming a second opening in the dielectric layer in the peripheral circuit region; forming a sidewall spacer over a sidewall of the second opening; recessing the silicon filler to form a silicon plug, wherein the silicon plug fills a lower portion of the first opening; and forming a first metal silicide over a top surface of the silicon plug, and concurrently forming a second metal silicide in a lower portion of the second opening.

18 Claims, 35 Drawing Sheets

(56) References Cited

U.S. PATENT DOCUMENTS

2012/0161324 A1\* 6/2012 Heinrich .......... H01L 21/28518
                                                    257/757
2012/0193696 A1   8/2012 Fukushima
2014/0131786 A1   5/2014 Ryu et al.
2015/0060970 A1   3/2015 Sasaki \* cited by examiner

SEMICONDUCTOR STRUCTURE AND METHOD FOR MANUFACTURING THE SAME

CROSS-REFERENCE TO RELATED APPLICATION

This application claims priority under 35 U.S.C. §119 to Korean Patent Application No. 10-2015-0125570 filed on Sep. 4, 2015, the disclosure of which is herein incorporated by reference in its entirety.

TECHNICAL FIELD

Exemplary embodiments relate to a semiconductor structure, and more particularly, to a semiconductor structure including metal silicide and a method for manufacturing the same.

DISCUSSION OF THE RELATED ART

In the manufacture of a semiconductor structure, metal silicide is formed to suppress leakage current and contact resistance. In addition, a contact area reduces in conformity with miniaturization of a semiconductor device.

Accordingly, it is necessary to sufficiently secure an area for forming metal silicide, to further decrease contact resistance.

SUMMARY

Various embodiments are directed to a semiconductor structure capable of sufficiently securing an area of a metal silicide even though openings are miniaturized, and a method for manufacturing the same.

Also, various embodiments are directed to a semiconductor structure capable of concurrently forming metal silicides in openings having different aspect ratios, and a method for manufacturing the same.

Further, various embodiments are directed to a semiconductor structure capable of concurrently forming metal silicides in a memory cell region and a peripheral circuit region, and a method for manufacturing the same.

In an embodiment, a method for manufacturing a semiconductor structure may include: preparing a substrate which includes a first doping region and a second doping region; forming a first opening which exposes the first doping region; forming a silicon region in a lower portion of the first opening; forming a second opening which exposes the second doping region; forming sidewall spacers in the second opening; forming a first metal-silicon region over the silicon region; and forming a second metal-silicon region over the second doping region. The forming of the silicon region in the lower of the first opening may include forming a silicon filler in the first opening; and recessing the silicon filler to forming the silicon region. The method may further include forming a first metal region over the first metal-silicon region, and concurrently forming a second metal region over the second metal-silicon region. The first opening has an aspect ratio larger than the second opening. The first opening and the second opening have the same height, and the first opening has a width smaller than the second opening. The forming of the first metal-silicon region and the second metal-silicon region may include forming a metal layer over the silicon region and the second doping region; forming the first metal-silicon region by reacting the silicon region and the metal layer; forming the second metal-silicon region by reacting the second doping region and the metal layer; and removing a non-reacted metal layer. The method may further include, before the forming of the first metal-silicon region and the second metal-silicon region, forming a first interface doping region over the silicon region; and forming a second interface doping region over the second doping region. The silicon region includes a polysilicon layer doped with a first dopant, and the forming of the first interface doping region may include doping an upper portion of the silicon region with a second dopant, wherein a doping concentration of the upper portion of the silicon region is higher than a lower portion of the silicon region; and performing a thermal processing to activate the second dopant in the upper portion of the silicon region to form the first interface doping region. The second doping region is formed by doping a third dopant, and the forming of the second interface doping region may include doping an upper portion of the second doping region with a fourth dopant, wherein the second interface doping region has a higher doping concentration than the second doping region; and performing a thermal processing to activate the fourth dopant in the second interface doping region. The first doping region may include a source/drain region of a first transistor, and the second doping region may include a source/drain region of a second transistor.

In an embodiment, a method for manufacturing a semiconductor structure may include: preparing a semiconductor substrate which includes a memory cell region and a peripheral circuit region; forming a buried word line in the semiconductor substrate in the memory cell region; forming a bit line structure over the semiconductor substrate in the memory cell region; forming a dielectric layer over the semiconductor substrate in the peripheral circuit region and the bit liner structure in the memory cell region; forming a first opening in the dielectric layer in the memory cell region; filling a silicon filler in the first opening; forming a second opening in the dielectric layer in the peripheral circuit region; forming a sidewall spacer over a sidewall of the second opening; recessing the silicon filler to form a silicon plug, wherein the silicon plug fills a lower portion of the first opening; and forming a first metal silicide over a top surface of the silicon plug, and concurrently forming a second metal silicide in a lower portion of the second opening. The method may further include forming a first metal plug and a second metal plug concurrently, the first metal plug fills the first opening and is provided over the first metal silicide, and the second metal plug fills the second opening and is provided over the second metal silicide. The method may further include before the forming of the first metal silicide and the second metal silicide, doping a first dopant into the top surface of the silicon plug to form a first interface doping region. The method may further include before the forming of the first metal silicide and the second metal silicide, doping a second dopant into the semiconductor substrate exposed by the second opening to form a second interface doping region. The forming of the second opening and forming the sidewall spacer may include masking the memory cell region including the silicon filler; forming the second opening by etching the dielectric layer in the peripheral circuit region; forming a spacer layer to cover a sidewall and a bottom surface of the second opening; and etching back the spacer layer to form the sidewall spacer over the sidewall of the second opening. The forming of the silicon plug may include masking the peripheral circuit region including the second opening; etching back the silicon filler and forming the silicon plug; doping the top surface of the silicon plug with a dopant; and performing a thermal processing to activate the dopant. The forming of the dielectric layer over the semiconductor substrate in the peripheral circuit region and the bit line in memory cell region may include forming a interlayer dielectric layer over the bit line in the memory cell region and the semiconductor substrate in peripheral circuit region; planarizing the interlayer dielectric layer such that a top surface of the bit line structure is exposed; forming plug isolation parts by partially etching portions of the interlayer dielectric layer; forming a plug isolation layer in the plug isolation parts; and removing the remaining interlayer dielectric layer from the memory cell region, the interlayer dielectric layer remains in the peripheral circuit region, and the plug isolation layer is formed in the memory cell region. The method may further include forming a gate structure in the peripheral circuit region by using the same material as the bit line structure, and the gate structure is formed substantially at the same time when the bit line structure is formed. The method may further include forming a first spacer element over a sidewall of the bit line structure; and forming a second spacer element over a sidewall of the gate structure. The method may further include forming an air gap by removing a portion of the first spacer element; and capping the air gap.

In an embodiment, a semiconductor structure may include: a semiconductor substrate including a first doping region and a second doping region; a first dielectric layer having a first opening which exposes the first doping region; a second dielectric layer having a second opening which exposes the second doping region; a first contact structure filling the first opening, wherein the first contact structure includes a silicon region and a first metal-silicon region, wherein the silicon region contacts the first doping region, wherein the first metal-silicon region is formed over the silicon region; a second contact structure filling the second opening, wherein the second contact structure includes a second metal-silicon region, wherein the second metal-silicon region contacts the second doping region; and a sidewall spacer formed between the second contact structure and a sidewall of the second opening. The first contact structure and the second contact structure may further include a first metal region over the first metal-silicon region and a second metal region over the second metal-silicon region, respectively. The silicon region may include a doped polysilicon. Each of the first metal-silicon region and the second metal-silicon region may include metal silicide. The sidewall spacer may include dielectric material. The first dielectric layer and the second dielectric layer are different materials from each other. The first opening has an aspect ratio larger than the second opening. The first opening and the second opening have the same height, and the first opening has a width smaller than the second opening. The first doping region is a portion of a first transistor, and the second doping region is a portion of the second transistor. The first contact structure may further include a first interface doping region between the silicon region and the first metal-silicon region. The first interface doping region may include a second dopant, and the first interface doping region has a higher doping concentration than the silicon region. The second contact structure may further include a second interface doping region formed between the second doping region and the second metal-silicon region.

In an embodiment, a semiconductor structure may include: a semiconductor substrate including a memory cell region and a peripheral circuit region, wherein the memory cell region includes a buried word line and a first doping region, wherein the peripheral circuit region includes a planar gate structure and a second doping region; a first dielectric layer formed over the semiconductor substrate in the memory cell region and having a first opening, wherein the first opening exposes the first doping region; a first contact structure formed in the first opening, wherein the first contact structure includes a silicon plug, a first metal silicide, and a first metal plug, wherein the silicon plug contacts the first doping region, wherein the first metal silicide is formed over the silicon plug, wherein the first metal plug over the first metal silicide; a second dielectric layer formed over the semiconductor substrate in peripheral circuit region and having a second opening, wherein the second opening exposes the second doping region and has an aspect ratio smaller than the first opening; a second contact structure formed in the second opening and including a second metal silicide and a second metal plug, wherein the second metal silicide contacts the second doping region, wherein the second metal plug is formed over the second metal silicide; and a sidewall spacer formed between the second contact structure and a sidewall of the second opening. The semiconductor structure may further include a bit line structure formed in the memory cell region; a spacer element provided over a sidewall of the bit line structure and formed in the memory cell region; and a memory element, formed in the memory cell region, the spacer element is provided between the bit line structure and the first contact structure, and the memory element is electrically coupled to the first contact structure. The spacer element may include an air gap. The semiconductor structure may further include a first interface doping region provided between the silicon plug and the first metal silicide. The semiconductor structure may further include a second interface doping region provided between the second doping region and the second metal silicide.

According to the embodiments, by forming a metal silicide in a spacer-free opening, it is possible to sufficiently secure an area for forming the metal silicide.

Also, according to the embodiments, it is possible to concurrently form metal silicide in an opening of a low aspect ratio and an opening of a high aspect ratio.

DETAILED DESCRIPTION

Figure 1:
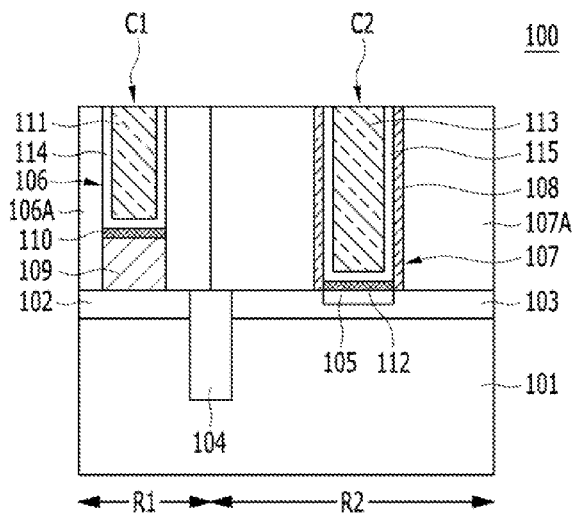
FIG. 1 is a view illustrating a semiconductor structure in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings may not be necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a view illustrating a semiconductor structure in accordance with a first embodiment.

Referring to FIG. 1, a semiconductor structure 100 in accordance with a first embodiment may include a first contact structure C1 and a second contact structure C2. The first contact structure C1 and the second contact structure C2 may have different aspect ratios. The aspect ratio refers to a ratio of a height with respect to a width of a given pattern. The given pattern may be a hole pattern or a pillar pattern. For example, the first contact structure C1 and the second contact structure C2 may have the same height as each other and different widths from each other.

The first contact structure C1 and the second contact structure C2 may be formed on a semiconductor substrate 101. The semiconductor substrate 101 may include a first doping region 102 and a second doping region 103. The first doping region 102 may be formed in a first region R1, and the second doping region 103 may be formed in the second region R2. The first region R1 and the second region R2 may be isolated by an isolation layer 104.

A third doping region 105 may be additionally formed in the second doping region 103. The first doping region 102 and the second doping region 103 may be doped with the same dopant or different dopants. The third doping region 105 and the second doping region 103 may be doped with the same dopant or different dopants. The third doping region 105 may be doped to have a higher concentration than the second doping region 103. The third doping region 105 may be referred to as an interface doping region. The contact resistance of the second contact structure C2 may be improved by the third doping region 105.

A first dielectric layer 106A and a second dielectric layer 107A may be formed on the semiconductor substrate 101. The first dielectric layer 106A may be formed in the first region R1, and the second dielectric layer 107A may be formed in the second region R2. The first dielectric layer 106A and the second dielectric layer 107A may be the same material or different materials.

The first dielectric layer 106A may have a first opening 106 which exposes a portion of the first doping region 102. The second dielectric layer 107A may have a second opening 107 which exposes a portion of the second doping region 103. The first opening 106 may have an aspect ratio larger than the second opening 107. In the present embodiment, the second opening 107 and the first opening 106 may have the same height and different widths. For example, the second opening 107 may have a width larger than the first opening 106.

The first contact structure C1 may be formed in the first opening 106. The second contact structure C2 may be formed in the second opening 107. The second contact structure C2 may include sidewall spacers 108. The first contact structure C1 does not include spacers. That is, the first contact structure C1 may be a spacer-free structure, and the second contact structure C2 may be a spacer-embedded structure. The sidewall spacers 108 may be positioned on the sidewalls of the second opening 107.

The first contact structure C1 may include a silicon region 109, a first metal-silicon region 110, and a first metal region 111. The second contact structure C2 may include the sidewall spacers 108, a second metal-silicon region 112 and a second metal region 113. The first contact structure C1 may be coupled to the first doping region 102. The second contact structure C2 may be coupled to the second doping region 103. The contact resistance of the second contact structure C2 is improved by the third doping region 105. The silicon region 109 may include a polysilicon, in particular, a doped polysilicon. The first metal-silicon region 110 and the second metal-silicon region 112 may include a metal silicide such as a cobalt silicide. The first metal region 111 and the second metal region 113 may include a metal such as tungsten.

A first barrier 114 may be formed between the first metal-silicon region 110 and the first metal region 111. A second barrier 115 may be formed between the second metal-silicon region 112 and the second metal region 113. The first barrier 114 and the second barrier 115 may include a metallic material to reduce resistances of the first and second contact structures C1 and C2. The first barrier 114 and the second barrier 115 may include titanium, a titanium nitride or a combination thereof.

The semiconductor structure 100 may include a plurality of transistors. For example, a first transistor may be formed in the first region R1, and a second transistor may be formed in the second region R2. The first doping region 102 may be a portion of the first transistor. The second doping region 103 may be a portion of the second transistor. The first transistor and the second transistor may be formed to be isolated by the isolation layer 104.

Figure 2A:
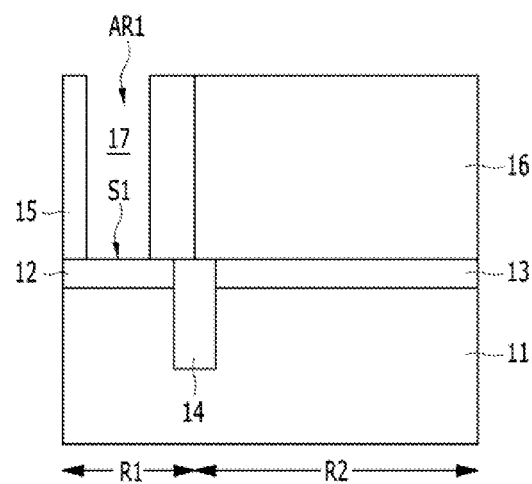
FIGS. 2A to 2N are views to assist in the explanation of a method for forming the semiconductor structure in accordance with the first embodiment.
Figure 2B:
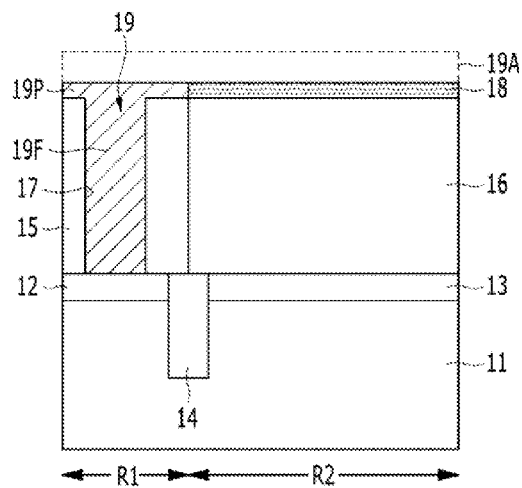
Figure 2C:
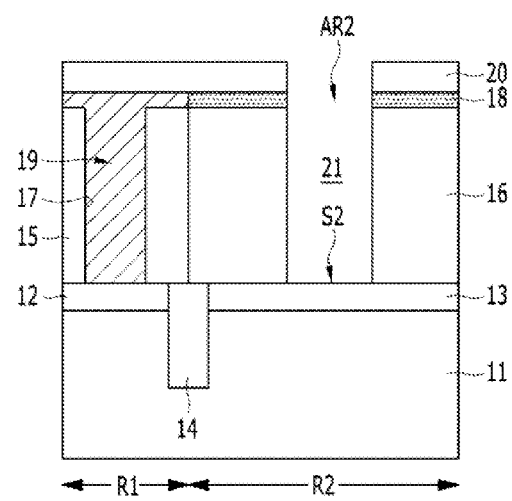
Figure 2D:
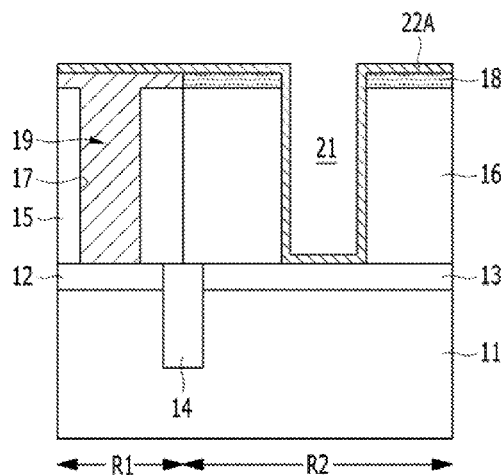
Figure 2E:
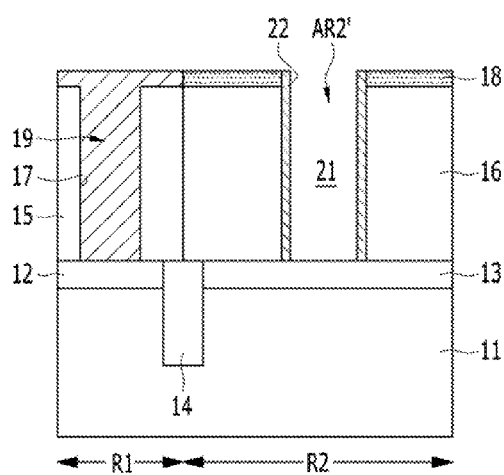
Figure 2F:
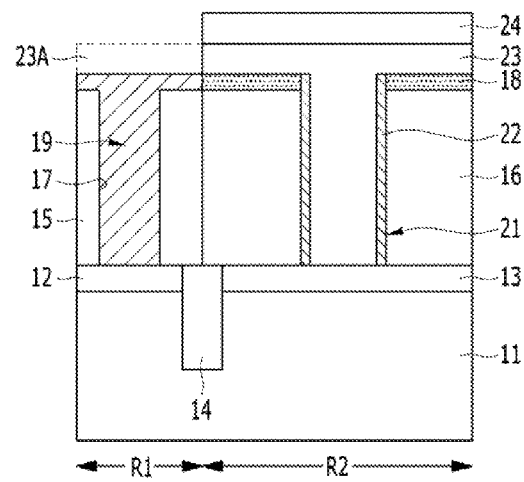
Figure 2G:
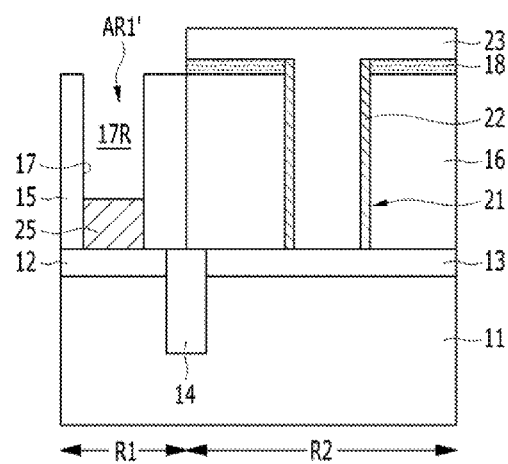
Figure 2H:
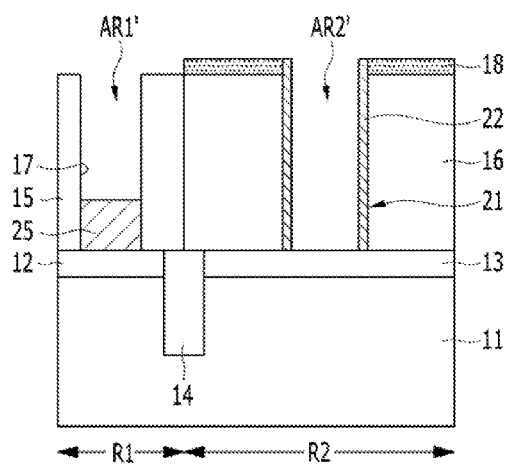
Figure 2I:
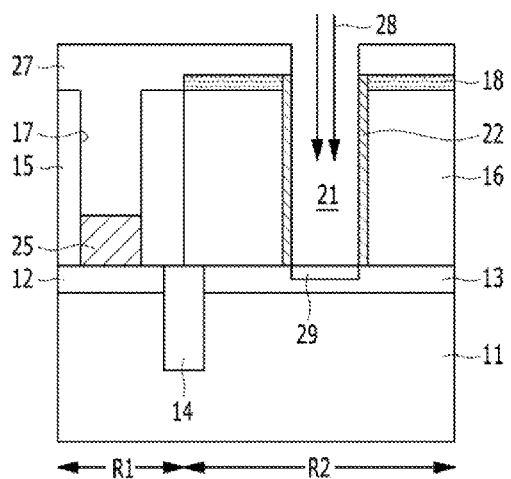
Figure 2J:
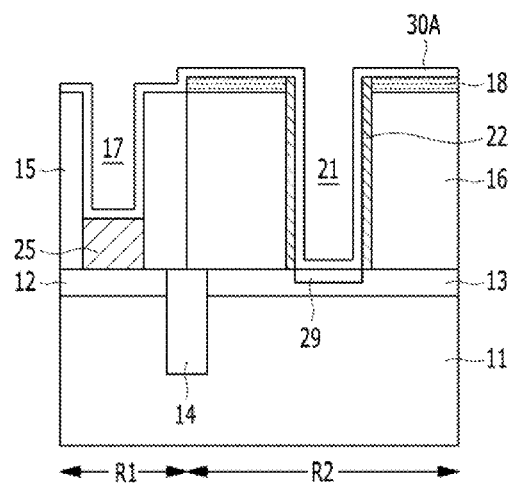
Figure 2K:
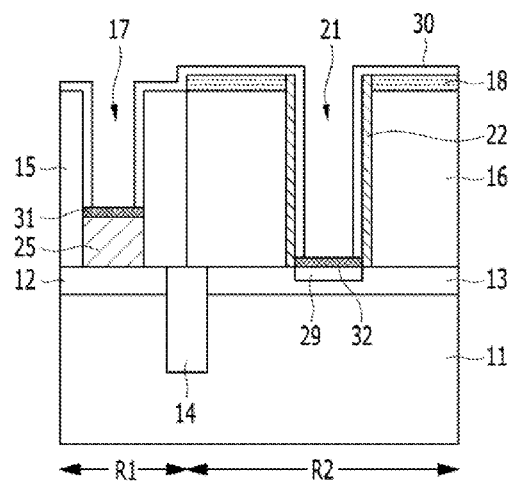
Figure 2L:
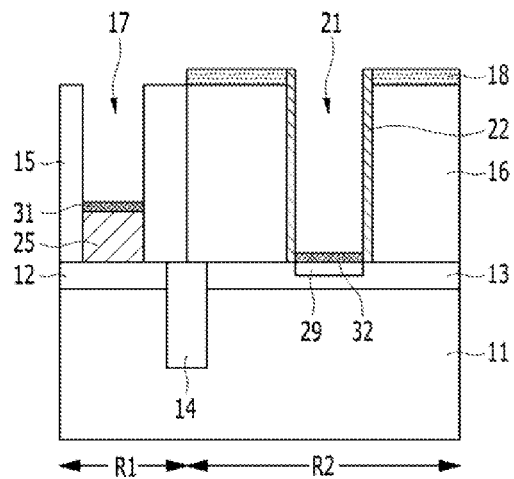
Figure 2M:
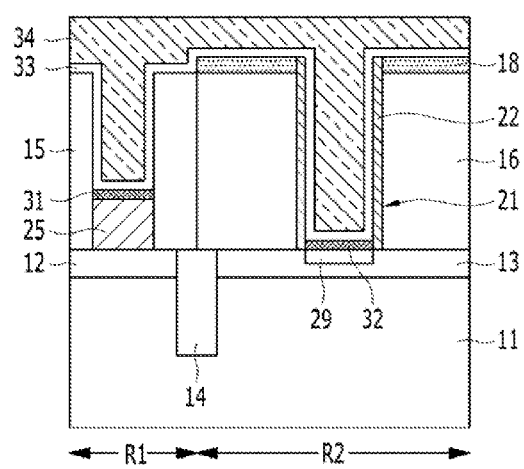
Figure 2N:
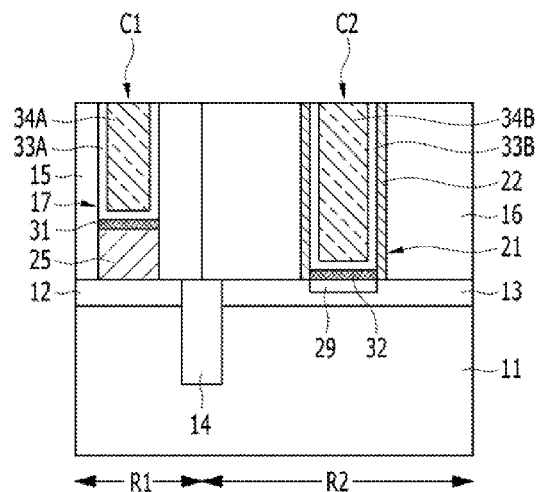

FIGS. 2A to 2N are illustrating a method for forming the semiconductor structure in accordance with the first embodiment.

As shown in FIG. 2A, a substrate 11 is prepared. The substrate 11 may include a first region R1 and a second region R2. Structures which will be formed in the first region R1 and the second region R2 may be symmetrical or asymmetrical to each other. For example, the structures which will be formed in the first region R1 and the second region R2 may be the same as each other. In another embodiment, the structures which will be formed in the first region R1 and the second region R2 may be different from each other. In another embodiment, the first region R1 may be a region in which a high density structure is formed, and the second region R2 may be a region in which a low density structure is formed.

For example, a plurality of structures which are densely spaced apart from one another may be formed in the first region R1 with a high density. A plurality of structures which are coarsely spaced apart from one another when compared to the plurality of structures of the first region R1 may be formed in the second region R2 with a low density. A structure to be formed in the first region R1 may have a width smaller than a structure to be formed in the second region R2. In the first region R1, a first transistor may be formed. In the second region R2, a second transistor may be formed. The first region R1 may include a memory cell, and the second region R2 may include a peripheral circuit.

The substrate 11 may include suitable materials for semiconductor processing. The substrate 11 may include a semiconductor substrate. For example, the substrate 11 may include a silicon substrate, a silicon germanium (SiGe) substrate or an SOI (Silicon On Insulator) substrate. Also, the substrate 11 may include a dielectric material or a conductive material. For example, the substrate 11 may include a silicon oxide, a silicon nitride, a polysilicon, a metallic material, or a combination thereof. The substrate 11 may include a dielectric material which is formed on a semiconductor substrate.

A first doping region 12 may be formed in the first region R1. The first doping region 12 may be formed in the substrate 11. The first doping region 12 may be a portion of a transistor. In other words, the first doping region 12 may be referred to as a source/drain region. The first doping region 12 may be doped with a dopant. The first doping region 12 may be formed by a doping technique such as implantation and plasma doping (PLAD). The first doping region 12 may be doped with an N type dopant or a P type dopant.

A second doping region 13 may be formed in the second region R2. The second doping region 13 may be formed in the substrate 11, The second doping region 13 may be a portion of a transistor. In other words, the second doping region 13 may be referred to as a source/drain region. The second doping region 13 may be doped with a dopant. The second doping region 13 may be formed by a doping technique such as implantation and plasma doping (PLAD). The second doping region 13 may be doped with an N type dopant or a P type dopant.

The first doping region 12 and the second doping region 13 may be formed to have a low concentration or a high concentration. In another embodiment, each of the first doping region 12 and the second doping region 13 may have a low concentration part and a high concentration part. The low concentration part may be referred to as an LDD.

The first region R1 and the second region R2 may be isolated from each other by an isolation layer 14. The isolation layer 14 may be an STI (shallow trench isolation) region. The isolation layer 14 may include a silicon oxide, a silicon nitride, or a combination thereof.

Dielectric layers 15 and 16 may be formed on the substrate 11. The dielectric layers 15 and 16 may include a silicon oxide, a silicon nitride, a low-k material, or a combination thereof. For example, the dielectric layers 15 and 16 may include $SiO_2$, TEOS, PSG, BPSG, BSG or SOD. Each of the dielectric layers 15 and 16 may be a single layer or multiple layers. The dielectric layers 15 and 16 may be formed through chemical vapor deposition (CVD) or other suitable techniques.

In the present embodiment, the first dielectric layer 15 may be formed in the first region R1, and the second dielectric layer 16 may be formed in the second region R2, The first dielectric layer 15 and the second dielectric layer 16 may be the same material or different materials. For example, the first dielectric layer 15 may be a silicon nitride, and the second dielectric layer 16 may be a silicon oxide. In another embodiment, each of the first dielectric layer 15 and the second dielectric layer 16 may be a silicon oxide or a silicon nitride. The first dielectric layer 15 may be multiple layers, and the second dielectric layer 16 may be a single layer. The first dielectric layer 15 may be formed as vertically stacked multiple layers, horizontally stacked multiple layers, or a combination thereof.

Next, a first opening 17 may be formed in the first dielectric layer 15. For example, a portion of the first dielectric layer 15 may be etched to form the first opening 17. The first opening 17 may have a first aspect ratio AR1. The first opening 17 may expose a first surface S1 of the substrate 11. When viewed from the top, the first opening 17 may have a circular shape, an elliptical shape or a rectangular shape. While forming the first opening 17 in the first region R1, the second dielectric layer 16 may be masked (not shown). The first surface S1 exposed by the first opening 17 may be a top surface of the first doping region 12. In another embodiment, the first surface S1 may be further recessed.

As shown in FIG. 2B, a filler 19 which fills the first opening 17 may be formed. The filler 19 may completely gapfill the first opening 17. The filler 19 may be formed of a conductive material. For example, the filler 19 may include a polysilicon. The filler 19 may include a doped polysilicon doped with a dopant. The filler 19 may be doped with phosphorus, arsenic or boron.

An example of forming the filler 19 is as follows. First, a protective layer 18 is formed on the second dielectric layer 16. The protective layer 18 may cover the second region R2 and expose the first region R1. The protective layer 18 may include a silicon nitride. Next, the first opening 17 is filled with a polysilicon layer 19A. As the polysilicon layer 19A, a seed layer, a doped polysilicon and an undoped polysilicon may be sequentially formed. The polysilicon layer 19A may be exposed to a subsequent thermal process.

Then, a planarization process such as CMP (chemical mechanical polishing) may be performed. The CMP process for the polysilicon layer 19A may be performed until the surface of the protective layer 18 is exposed. As a result, a step between the first region R1 and the second region R2 may be removed. The filler 19 and the protective layer 18 may be coplanar to each other. The filler 19 may include a filler part 19F which fills the first opening 17 and a planar part 19P which is on the filler part 19F. The planar part 19P may cover the filler part 19F and the first dielectric layer 15. The planar part 19P does not extend to the second region R2. In another embodiment, the filler 19 may include only the filler part 19F without the planar part 19P. In this way, by using the polysilicon layer 19A, it is possible to void-freely gapfill the first opening 17. In another embodiment, the gapfill and CMP processes for the polysilicon layer 19A may be performed without forming the protective layer 18.

As shown in FIG. 2C, a second opening 21 may be formed. The second opening 21 may be formed in the second dielectric layer 16. For example, in order to form the second opening 21, the protective layer 18 and the second dielectric layer 16 may be etched by an etch process using a first mask layer 20. The second opening 21 may have a second aspect ratio AR2. The first aspect ratio AR1 and the second aspect ratio AR2 may be the same or different from each other.

For example, the first opening 17 and the second opening 21 may have the same height and different widths. The second opening 21 may have a width larger than the first opening 17. According to this fact, the first aspect ratio AR1 may be larger than the second aspect ratio AR2. The second opening 21 may expose a second surface S2 of the substrate 11. When viewed from the top, the second opening 21 may have a circular shape, an elliptical shape or a rectangular shape.

While forming the second opening 21 in the second region R2, the first region R1 may be protected by the first mask layer 20. The second surface S2 exposed by the second opening 21 may be a top surface of the second doping region 13. In another embodiment, the second surface S2 may be further recessed. The first mask layer 20 may include a photoresist pattern. In another embodiment, the first mask layer 20 may be a hard mask material such as an SOC (Spin On Carbon), TEOS and an amorphous carbon.

As shown in FIG. 2D, the first mask layer 20 may be removed. Then, a spacer layer 22A may be formed. The spacer layer 22A may be formed of a material which has an etching selectivity with respect to the second dielectric layer 16. For example, in the case where the second dielectric layer 16 is formed of a silicon oxide, the spacer layer 22A may be formed of a silicon nitride. When the second dielectric layer 16 is formed of a silicon nitride, the spacer layer 22A may be formed of a silicon oxide. The spacer layer 22A may prevent upper sidewalls of the second opening 21 from bending, bowing, or being distorted. In another embodiment, the spacer layer 22A may also be formed in the first region R1.

As shown in FIG. 2E, sidewall spacers 22 may be formed in the second opening 21. In order to form the sidewall spacers 22, an etch-back process may be performed. In the etch-back process, the spacer layer 22A may be removed completely from the first region R1. Therefore, the sidewall spacers 22 may expose the bottom surface of the second opening 21 and be formed on only the sidewalls of the second opening 21. During the etching process for forming the sidewall spacers 22, the second surface S2 of the second doping region 13 may be recessed to a predetermined depth.

The sidewall spacers 22 may have a thickness of at least 30 Å. By this fact, it is possible to firmly form the sidewall spacers 22 without bowing. In the case where the thickness of the sidewall spacers 22 is thinner than 30 Å, the sidewall spacers 22 may be lost and bowing is likely to occur in the upper sidewalls of the second opening 21. The bowing may cause bridging between neighboring second openings 21.

The second opening 21 may have a corrected second aspect ratio AR2' which is larger than the second aspect ratio AR2, The change in the aspect ratio is attributed to the sidewall spacers 22.

As shown in FIG. 2F, a blocking layer 23A may be formed. The blocking layer 23A may completely fill the second opening 21 on the sidewall spacers 22. The blocking layer 23A may also be formed in the first region R1. Namely, a portion of the blocking layer 23A may cover the filler 19. The blocking layer 23A may be formed of a carbon-containing material. The blocking layer 23A may be formed by Spin on Coating. Due to this fact, it is possible to void-freely fill the blocking layer 23A in the second opening 21. The blocking layer 23A may include an SOC (Spin On Carbon).

A second mask layer 24 may be formed on the blocking layer 23A. The second mask layer 24 may expose the first region R1 and cover the second region R2. The second mask layer 24 may include a photoresist pattern. The second mask layer 24 may also be referred to as a 'first region open mask.'

By using the second mask layer 24 as an etch barrier, the blocking layer 23A is removed from the first region R1. Accordingly, a blocking pattern 23 may be formed in the second region R2. The blocking pattern 23 may fill the second opening 21 which is formed with the sidewall spacers 22.

As shown in FIG. 2G, the second mask layer 24 may be removed. Then, the filler 19 may be recessed so that a top surface of the filler 19 is located at a lower level than a top surface of the first dielectric layer 15. Thus, a silicon region 25 may be formed in the first opening 17. In order to recess the filler 19, an etch-back process may be performed. Meanwhile, during the etch-back process, the second region R2 may be protected by the blocking pattern 23. Since the filler 19 includes a polysilicon, the silicon region 25 may be a polysilicon region. The silicon region 25 may be also referred to as a 'polysilicon plug.'

Due to the presence of the silicon region 25, the first opening 17 has a recess portion 17R. The recess portion 17R may have a corrected first aspect ratio AR1'. The corrected first aspect ratio AR1' may be smaller than the initial first aspect ratio AR1.

As shown in FIG. 2H, the blocking pattern 23 may be removed. The blocking pattern 23 may be removed by a strip process using oxygen plasma.

By the series of processes described above, the silicon region 25 may be formed in the first region R1, and the sidewall spacers 22 may be formed in the second region R2. That is, the silicon region 25 may be partially filled in the first opening 17, and the sidewall spacers 22 may be formed on the sidewalls of the second opening 21. As a result, the first opening 17 may be partially filled with the silicon region 25 with no sidewall spacer, that is, a spacer-free structure. Sidewall spacers do not exist in the first opening 17, and the sidewall spacers 22 exist in the second opening 21. This is referred to as an asymmetrical opening structure.

The first opening 17 may have the corrected first aspect ratio AR1' which is smaller than the first aspect ratio AR1. The reduction of the first aspect ratio is due to the silicon region 25. The second opening 21 may have the corrected second aspect ratio AR2' which is larger than the second aspect ratio AR2. The change in the second aspect ratio is due to the sidewall spacers 22. The change between the corrected first aspect ratio AR1' and the original first aspect ratio AR1 may be larger than the change between the aspect ratio the corrected second aspect ratio AR2' and the original second aspect ratio AR2. Accordingly, the corrected first aspect ratio AR1' may be smaller than the corrected second aspect ratio AR2'.

As shown in FIG. 2I, a third doping region 29 may be formed in the second region R2. The third doping region 29 may be formed in the second doping region 13. The third doping region 29 may be formed to decrease a contact resistance. The third doping region 29 may be referred to as an interface doping region. The third doping region 29 may be doped with a dopant. The third doping region 29 may be formed by a doping technique such as implantation and plasma doping (PLAD). The third doping region 29 may be doped with an N type dopant or a P type dopant. The second doping region 13 and the third doping region 29 may be doped with the same dopant or different dopants.

In order to form the third doping region 29, a doping process 28 using a third mask layer 27 may be performed. The third mask layer 27 may cover the first region R1. The third mask layer 27 may selectively expose the second opening 21 and cover the other portion of the second region R2.

As shown in FIG. 2J, the third mask layer 27 may be removed. Then, a metal layer 30A may be formed. The metal layer 30A may be formed on the entire surface including the silicon region 25 and the sidewall spacers 22. The metal layer 30A may be formed to a uniform thickness without filling the first opening 17 and the second opening 21. The metal layer 30A may be a silicidable material. For example, a metal contained in the metal layer 30A may react with the silicon region 25. Further, the metal contained in the metal layer 30A may react with the substrate 11, that is, the third doping region 29. In the present embodiment, the metal layer 30A may include cobalt. The metal layer 30A may be formed by a deposition method such as ALD (atomic layer deposition) and CVD (chemical vapor deposition).

Before forming the metal layer 30A, the surfaces of the silicon region 25 and the third doping region 29 are exposed. The surface of the third doping region 29 may include silicon, which is a portion of the substrate 11. Similarly to this, the silicon region 25 may also include silicon. Therefore, portions of the metal layer 30A may be formed on surfaces in which silicon is contained, and the other portions of the metal layer 30A may be formed on the first dielectric layer 15, the protective layer 18 and the sidewall spacers 22. In another embodiment, the metal layer 30A may include a metal such as titanium and nickel, instead of cobalt.

As shown in FIG. 2K, a thermal process may be performed. By the thermal process, metal-silicon regions 31 and 32 may be formed. The metal-silicon regions 31 and 32 may be concurrently formed in the first opening 17 and the second opening 21, respectively. For example, the metal-silicon regions 31 and 32 may be a metal silicide. The metal-silicon regions 31 and 32 may include a cobalt silicide.

The metal-silicon regions 31 and 32 may include a first metal-silicon region 31 and a second metal-silicon region 32. The first metal-silicon region 31 may be formed in the first opening 17. The second metal-silicon region 32 may be formed in the second opening 21. The first metal-silicon region 31 may be formed on the silicon region 25. The second metal-silicon region 32 may be formed on the bottom surface of the second opening 21, that is, the third doping region 29. The first metal-silicon region 31 may be formed by reaction between silicon of the silicon region 25 and metal of the metal layer 30A. The second metal-silicon region 32 may be formed by reaction between metal of the metal layer 30A and silicon of the third doping region 29. After the thermal process, a non-reacted metal layer 30 may remain.

The first metal-silicon region 31 and the second metal-silicon region 32 are not limited to a cobalt silicide. For example, by using another metal (for example, such as titanium and nickel) capable of forming a silicide by reacting with silicon, metal-silicon regions may be formed. When the first metal-silicon region 31, the second metal-silicon region 32, or both includes cobalt silicide, a leakage current can be significantly reduced since cobalt silicide has a low resistance.

As shown in FIG. 2L, the non-reacted metal layer 30 may be selectively removed. The silicon region 25 and the first metal-silicon region 31 may remain in the first opening 17. The second metal-silicon region 32 and the sidewall spacers 22 may remain in the second opening 21. The second metal-silicon region 32 may contact the third doping region 29. The first metal-silicon region 31 may contact the silicon region 25.

As shown in FIG. 2M, a conductive layer may be filled in the first opening 17 and the second opening 21. The conductive layer may be a material which has a resistance lower than the silicon region 25. For example, the conductive layer may be a metallic material. As the conductive layer, a first metallic layer 33 and a second metallic layer 34 may be sequentially formed. The first metallic layer 33 may include Ti, TiN or Ti/TiN. The second metallic layer 34 may include tungsten.

Since sidewall spacers do not exist in the first opening 17, it is possible to sufficiently gapfill the first metallic layer 33 and the second metallic layer 34. Due to this fact, by increasing the volume of a metal-based material, and a resistance may be decreased. As a comparative example, assuming that sidewall spacers exist in the first opening 17, a space in which the first metallic layer 33 and the second metallic layer 34 are to be formed may be insufficient or the first and second metallic layers 33 and 34 may not be formed. In some cases, the first metallic layer 33 and the second metallic layer 34 may not extend to either a bottom of the first opening 17 or a bottom of the second opening 21. This may result in a disconnection between the first metallic layer 33 and the first doping region 12 and between the second metallic layer 34 and the second doping region 13, causing a malfunction of the semiconductor device.

As shown in FIG. 2N, the first metallic layer 33 and the second metallic layer 34 may be planarized by CMP in such a manner that they remain only in the first opening 17 and the second opening 21. As a result, a first barrier 33A and a first metal region 34A may be formed in the first opening 17. A second barrier 33B and a second metal region 34B may be formed in the second opening 21. Since the first metal region 34A and the second metal region 34B are metal-based material, they may be also referred to as 'metal plugs.' The first barrier 33A and the second barrier 33B may be concurrently formed, and the first metal region 34A and the second metal region 34B may also be concurrently formed. During the CMP process, the protective layer 18 may be removed.

According to the above descriptions, a first contact structure C1 may be formed in the first region R1, and a second contact structure C2 may be formed in the second region R2. The first contact structure C1 may include the silicon region 25, the first metal-silicon region 31, the first barrier 33A, and the first metal region 34A. The second contact structure C2 may include the second metal-silicon region 32, the second barrier 33B, and the second metal region 34B. The first contact structure C1 and the second contact structure C2 may include the first metal-silicon region 31 and the second metal-silicon region 32, respectively. Both the first contact structure C1 and the second contact structure C2 may include metallic materials, that is, the first barrier 33A, the second barrier 33B, the first metal region 34A and the second metal region 34B. The second metal region 34B and the second metal-silicon region 32 may include different metals. The first metal region 34A and the first metal-silicon region 31 may include different metals. In other words, the first metal region 34A and the second metal region 34B may include tungsten, and the first and second metal-silicon regions 31 and 32 may include cobalt.

The first contact structure C1 and the second contact structure C2 may be asymmetrical to each other in structure. For example, the first contact structure C1 and the second contact structure C2 may become asymmetrical to each other due to the sidewall spacers 22 and the silicon region 25. The first contact structure C1 may be a spacer-free structure, and the second contact structure C2 may be a spacer-embedded structure in which the sidewall spacers 22 are embedded. The first contact structure C1 includes the silicon region 25 and the first metal region 34A while the second contact structure C2 includes only the second metal region 34. The first contact structure C1 including the silicon region 25, which is a silicon-based material, and the first metal region 34A, which is a metal-based material, may also be referred to as a semi-metal plug (SMP) or a hybrid plug. The second contact structure C2 includes only a metal plug.

Figure 3:
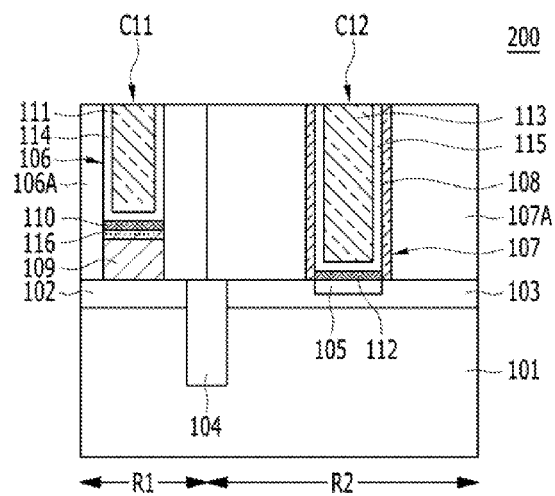
FIG. 3 is a view illustrating a semiconductor structure in accordance with a second embodiment.

FIG. 3 is a view illustrating a semiconductor structure in accordance with a second embodiment. Referring to FIG. 3, a semiconductor structure 200 in accordance with a second embodiment may include a first contact structure C11 and a second contact structure C12. The first contact structure C11 and the second contact structure C12 may have different aspect ratios from each other. In the second embodiment, the first contact structure C11 may further include an interface doping region 116. The other construction may be the same as or similar to FIG. 1.

The first contact structure C11 according to the second embodiment, which is a spacer-free structure, may include a silicon region 109, the interface doping region 116, a first metal-silicon region 110, and a first metal region 111. The interface doping region 116 improves a contact resistance between the silicon region 109 and the first metal-silicon region 110. The interface doping region 116 and the silicon region 109 may be the same material. The interface doping region 116 may have a higher concentration than the dopant doped into the silicon region 109. The interface doping region 116 and the silicon region 109 may be doped with the same dopant. The interface doping region 116 may include a polysilicon, in particular, a doped polysilicon. The silicon region 109 may include a doped polysilicon as well.

FIGS. 4A to 4H illustrates a method for forming the semiconductor structure in accordance with the second embodiment. Except that the semiconductor structure in accordance with the second embodiment may include an interface doping region 26, the semiconductor structure may be the same as or similar to the first embodiment. For example, the silicon region 25 may be formed by the method shown in FIGS. 2A to 2G.

Figure 4A:
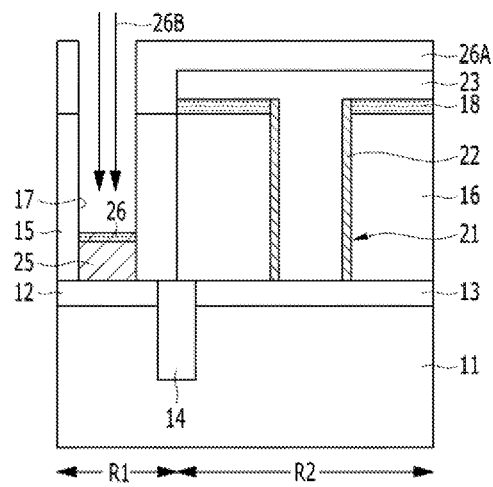
FIGS. 4A to 4H are representations a method for forming the semiconductor structure in accordance with the second embodiment.

Next, as shown in FIG. 4A, a dopant may be doped into the silicon region 25. The dopant may be doped by a doping process 26B such as implantation and plasma doping (PLAD). For example, implantation may be performed at least 2 times. The doping process 26B may be performed by using an ion implantation mask layer 26A and the blocking pattern 23 as a barrier. The ion implantation mask layer 26A may selectively expose the first opening 17 and cover the other regions. Accordingly, due to the ion implantation mask layer 26A and the blocking pattern 23, a dopant is not doped into the second region R2.

Upon the doping process 26B, a top portion of the silicon region 25 may be converted into the interface doping region 26. An interfacial resistance may be reduced by the interface doping region 26. Namely, the interfacial resistance between the silicon region 25 and a first metal region 34A (see FIG. 4H) may be decreased. The interface doping region 26 and the silicon region 25 may be doped with the same dopant. The interface doping region 26 may be doped to a higher concentration than the silicon region 25 so that the interfacial resistance may be further improved.

Figure 4B:
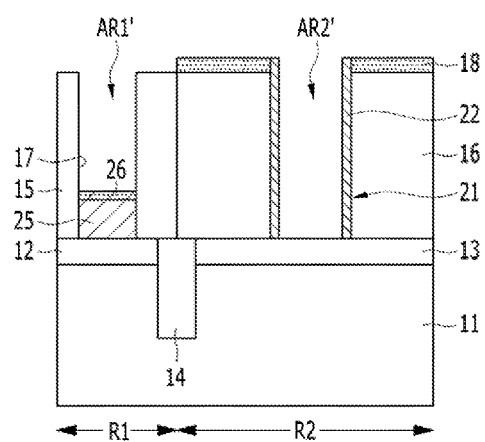

As shown in FIG. 4B, the ion implantation mask layer 26A and the blocking pattern 23 may be removed. The ion implantation mask layer 26A may be removed by a strip process using oxygen plasma. The blocking pattern 23 may also be removed by oxygen plasma.

In order to activate the dopant implanted into the interface doping region 26, a thermal process may be performed. The thermal process may be performed at a temperature of 500° C. to 1100° C. by rapid thermal anneal (RTA).

By the series of processes described above, the silicon region 25 and the interface doping region 26 may be formed in the first region R1, and the sidewall spacers 22 may be formed in the second region R2. That is, the silicon region 25 and the interface doping region 26 may be partially filled in the first opening 17, and the sidewall spacers 22 may be formed on the sidewalls of the second opening 21. As a result, the first opening 17 may be partially filled with the silicon region 25 with no sidewall spacers, that is, a spacer-free structure Sidewall spacers do not exist in the first opening 17, and the sidewall spacers 22 exist in the second opening 21. This is referred to as an asymmetrical opening structure.

The first opening 17 may have the corrected first aspect ratio AR1' which is smaller than the first aspect ratio AR1. The reduction of the first aspect ratio is due to the silicon region 25 and the interface doping region 26. The second opening 21 may have the corrected second aspect ratio AR2' which is larger than the second aspect ratio AR2. The change in the second aspect ratio is due to the sidewall spacers 22. The change between the corrected first aspect ratio AR1' and the original first aspect ratio AR1 may be larger than the change the corrected second aspect ratio AR2' and the original second aspect ratio AR2. Accordingly, the corrected first aspect ratio AR1' may be smaller than the corrected second aspect ratio AR2'.

Figure 4C:
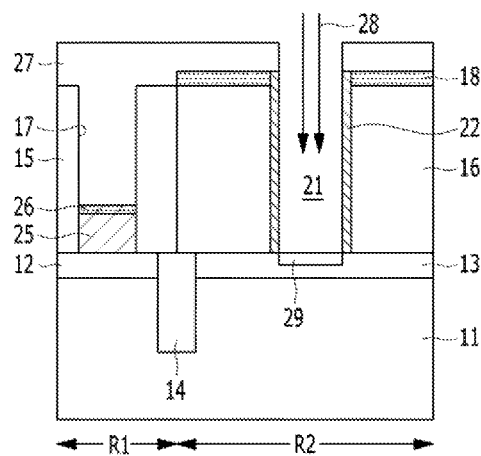

As shown in FIG. 4C, a third doping region 29 may be formed in the second region R2. The third doping region 29 may be formed in the second doping region 13. The third doping region 29 may be formed to decrease a contact resistance. The third doping region 29 may be referred to as an interface doping region. The third doping region 29 may be doped with a dopant. The third doping region 29 may be formed by a doping technique such as implantation and plasma doping (PLAD). The third doping region 29 may be doped with an N type dopant or a P type dopant. The second doping region 13 and the third doping region 29 may be doped with the same dopant or different dopants.

In order to form the third doping region 29, a doping process 28 using a third mask layer 27 may be performed. The third mask layer 27 may cover the first region R1. The third mask layer 27 may selectively expose the second opening 21 and cover the other portion of the second region R2.

Figure 4D:
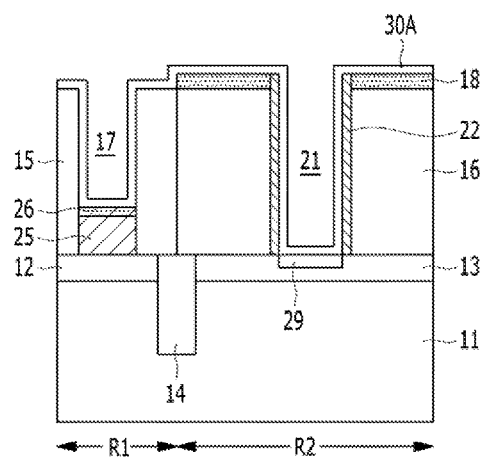

As shown in FIG. 4D, the third mask layer 27 may be removed. Then, a metal layer 30A may be formed. The metal layer 30A may be formed on the entire surface including the silicon region 25 and the sidewall spacers 22. The metal layer 30A may be conformally formed without filling the first opening 17 and the second opening 21. That is, the metal layer 30A is formed to a uniform thickness. The metal layer 30A may be a silicidable material. For example, a metal contained in the metal layer 30A may react with the interface doping region 26. Further, the metal contained in the metal layer 30A may react with the substrate 11, that is, the third doping region 29. In the present embodiment, the metal layer 30A may include cobalt. The metal layer 30A may be formed by a deposition method such as ALD and CVD.

Before forming the metal layer 30A, the interface doping region 26 and the third doping region 29 are exposed. The third doping region 29 may be a portion of the substrate 11, and thus include silicon. Similarly, the interface doping region 26 may also include silicon. Therefore, portions of the metal layer 30A may be formed on surfaces in which silicon is contained, and the other portions of the metal layer 30A may be formed on the first dielectric layer 15, the protective layer 18 and the sidewall spacers 22. In another embodiment, the metal layer 30A may include a metal such as titanium and nickel, instead of cobalt.

Figure 4E:
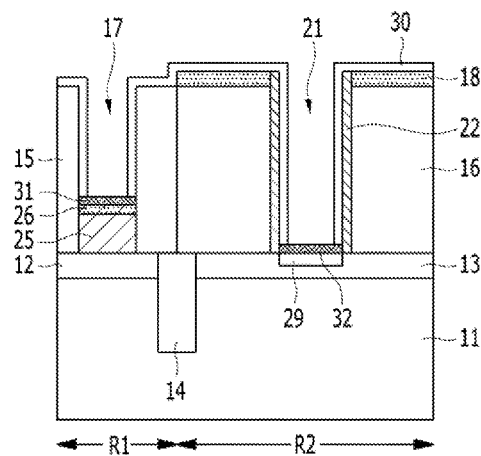

As shown in FIG. 4E, a thermal process may be performed. By the thermal process, metal-silicon regions 31 and 32 may be formed. The metal-silicon regions 31 and 32 may be concurrently formed in the first opening 17 and the second opening 21, respectively. For example, the metal-silicon regions 31 and 32 may be metal silicide. The metal-silicon regions 31 and 32 may include cobalt silicide.

The metal-silicon regions 31 and 32 may include a first metal-silicon region 31 and a second metal-silicon region 32. The first metal-silicon region 31 may be formed in the first opening 17. The second metal-silicon region 32 may be formed in the second opening 21. The 1o first metal-silicon region 31 may be formed on the interface doping region 26. The second metal-silicon region 32 may be formed on the bottom surface of the second opening 21, that is, the third doping region 29. The first metal-silicon region 31 may be formed by reaction between silicon of the interface doping region 26 and metal of the metal layer 30A. The second metal-silicon region 32 may be formed by reaction between metal of the metal layer 30A and silicon of the third doping region 29.

After the thermal process, a non-reacted metal layer 30 may remain. The first metal-silicon region 31 and the second metal-silicon region 32 are not limited to cobalt silicide. For example, by using another metal, for example, such as titanium and nickel which is capable of forming silicide by reacting with silicon, metal-silicon regions may be formed. Due to the first metal-silicon region 31 and the second metal-silicon region 32, which may include cobalt silicide, a leakage current may be suppressed and a resistance may be reduced.

Figure 4F:
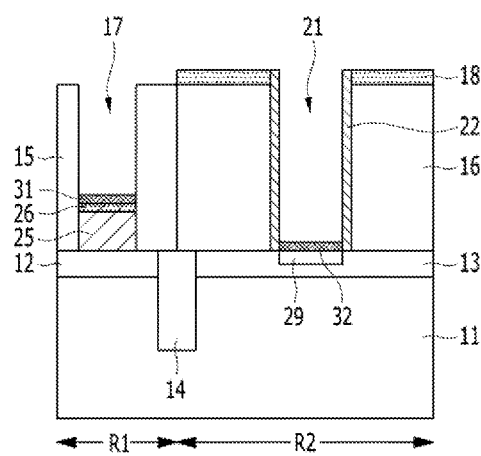

As shown in FIG. 4F, the non-reacted metal layer 30 may be selectively removed. Thus, the silicon region 25, the interface doping region 26 and the first metal-silicon region 31 may remain in the first opening 17. The second metal-silicon region 32 and the sidewall spacers 22 may remain in the second opening 21. The second metal-silicon region 32 may contact the third doping region 29. The first metal-silicon region 31 may contact the interface doping region 26.

Figure 4G:
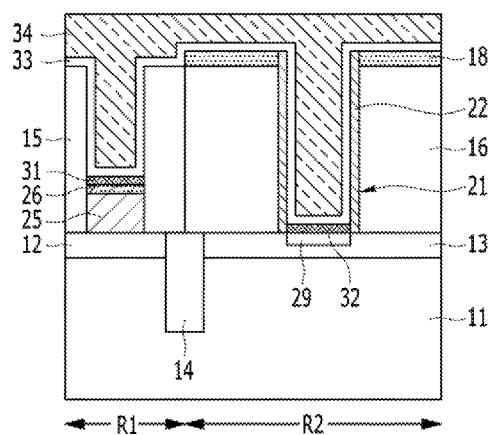

As shown in FIG. 4G, a conductive layer may be filled in the first opening 17 and the second opening 21. The conductive layer may have a resistance lower than the silicon region 25 and the interface doping region 26. For example, the conductive layer may be a metallic material. As the conductive layer, a first metallic layer 33 and a second metallic layer 34 may be sequentially formed. The first metallic layer 33 may include Ti, TiN or Ti/TiN. The second metallic layer 34 may include tungsten.

Since sidewall spacers are not formed in the first opening 17, an opening defined by the first opening 17 may be relatively wide compared with when the sidewall spacers are formed. Thus, it is easy to completely gapfill the opening to form a stack of the first metallic layer 33 and the second metallic layer 34. Due to this fact, by increasing the volume of a metal-based material, a resistance may be reduced. As a comparative example, in the case where sidewall spacers exist in the first opening 17, an opening defined by the first opening 17 is relatively narrow. Thus, it is difficult to completely fill the first metallic layer 33 and the second metallic layer 34 in the narrow opening, causing void or a seam.

Figure 4H:
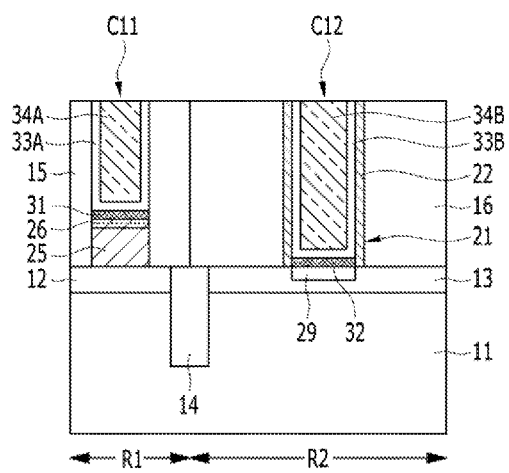

As shown in FIG. 4H, the first metallic layer 33 and the second metallic layer 34 may be planarized by CMP in such a manner that they remain only in the first opening 17 and the second opening 21. As a result, a first barrier 33A and a first metal region 34A may be formed in the first opening 17. A second barrier 33B and a second metal region 34B may be formed in the second opening 21. Since the first metal region 34A and the second metal region 34B are metal-based materials, they may be referred to as 'metal plugs.' The first barrier 33A and the second barrier 33B may be concurrently formed, and the first metal region 34A and the second metal region 34B may also be concurrently formed. During the CMP process, the protective layer 18 may be removed.

According to the above descriptions, a first contact structure C11 may be formed in the first region R1, and a second contact structure C12 may be formed in the second region R2. The first contact structure C11 may include the silicon region 25, the interface doping region 26, the first metal-silicon region 31, the first barrier 33A, and the first metal region 34A. The second contact structure C12 may include the second metal-silicon region 32, the second barrier 33B, and the second metal region 34B. The first contact structure C11 and the second contact structure C12 may include the first metal-silicon region 31 and the second metal-silicon region 32, respectively. Both the first contact structure C11 and the second contact structure C12 may include metallic materials, that is, the first barrier 33A, the second barrier 33B, the first metal region 34A and the second metal region 34B.

The first contact structure C11 and the second contact structure C12 may be asymmetrical to each other in structure. For example, the first contact structure C11 and the second contact structure C12 may become asymmetrical structures due to a difference in the sidewall spacers 22 and the silicon region 25, The first contact structure C11 may be a spacer-free structure, and the second contact structure C12 may be a spacer-embedded structure in which the sidewall spacers 22 are embedded. The first contact structure C11 includes the silicon region 25 and the first metal region 34A whereas the second contact structure C12 includes only the second metal region 34B. The first contact structure C11 including the silicon region 25 which is silicon-based and the first metal region 34A which is metal-based may be referred to as a semi-metal plug (SMP) or a hybrid plug. The second contact structure C12 includes only a metal plug.

According to the first embodiment and the second embodiment described above, the first contact structures C1 and C11 and the second contact structures C2 and C12 are asymmetrical to each other in structure, and the first metal-silicon region 31 and the second metal-silicon region 32 may be concurrently formed. In particular, since sidewall spacers are not formed in the first opening 17, a wide area for forming the first metal-silicon region 31 may be secured. As a result, an ohmic contact characteristic may be improved. Since the sidewall spacers 22 are formed in the second opening 21, it is possible to substantially prevent a bowing profile on top sidewalls of the second opening 21.

Figure 5A:
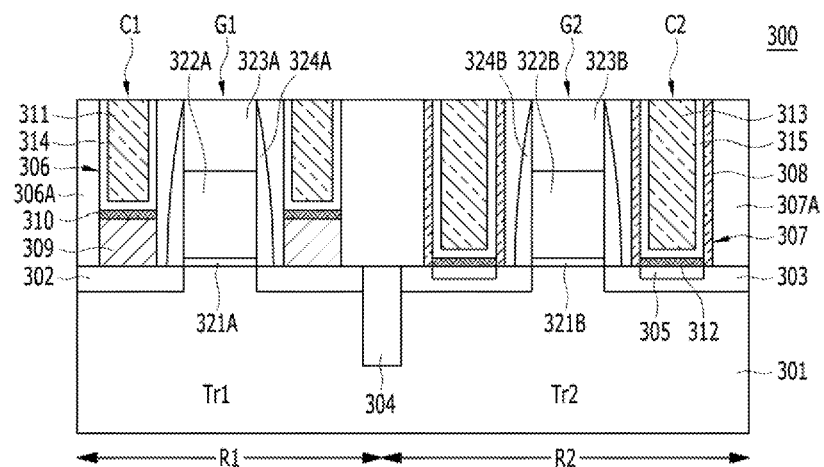
FIGS. 5A and 5B are views illustrating semiconductor structures in accordance with a third embodiment and a modification thereof.
Figure 5B:
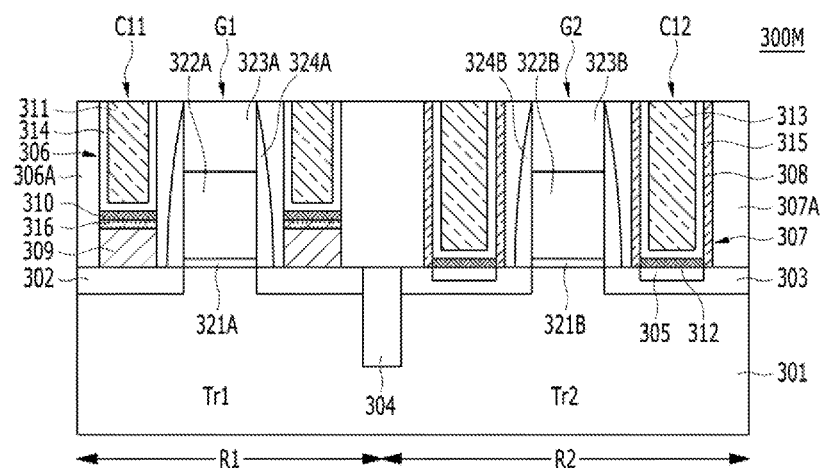

FIG. 5A is a view illustrating a semiconductor structure in accordance with a third embodiment. FIG. 5B is a view illustrating a semiconductor structure in accordance with a modification of the third embodiment.

Referring to FIG. 5A, a semiconductor structure 300 in accordance with a third embodiment may include a first transistor Tr1, a second transistor Tr2, first contact structures C1 coupled to the first transistor Tr1, and second contact structures C2 coupled to the second transistor Tr2.

The first transistor Tr1 may include a first planar gate structure G1 and a pair of first doping regions 302. The pair of first doping regions 302 may be respectively positioned in a substrate 301 and at both sides of the first planar gate structure G1. The first contact structures C1 may be coupled to the pair of first doping regions 302, respectively. The first planar gate structure G1 may include a first gate dielectric layer 321A, a first gate electrode 322A, and a first gate cap layer 323A. First gate spacers 324A may be formed on both sidewalls of the first planar gate structure G1. The pair of first doping regions 302 may be source and drain regions of the first transistor Tr1.

The second transistor Tr2 may include a second planar gate structure G2 and a pair of second doping regions 303. The pair of second doping regions 303 may be respectively positioned in the substrate 301 and at both sides of the second planar gate structure G2. The second contact structures C2 may be coupled to the pair of second doping regions 303, respectively. The second planar gate structure G2 may include a second gate dielectric layer 321B, a second gate electrode 322B, and a second gate cap layer 323B. Second gate spacers 324B may be formed on both sidewalls of the second planar gate structure G2. The pair of second doping regions 303 may be source and drain regions of the second transistor Tr2. Third doping regions 305 may be formed in the second doping regions 303. The third doping regions 305 and the second contact structures C2 may contact each other.

The first transistor Tr1 and the second transistor Tr2 may be isolated by an isolation layer 304. The first transistor Tr1 and the second transistor Tr2 may be the same type or different types. For example, both of the first transistor Tr1 and the second transistor Tr2 may be NMOSFETs or PMOSFETs. Further, any one transistor of the first transistor Tr1 and the second transistor Tr2 may be an NMOSFET, and the other transistor may be a PMOSFET. In the latter case, the first doping regions 302 and the second doping regions 303 may be doped with different dopants.

The first contact structures C1 may be the same as the first contact structure C1 according to the first embodiment. For example, each first contact structure C1 may be formed in a first opening 306 with no spacers. The first opening 306 may be formed in a first dielectric layer 306A and exposes a portion of the first doping region 302. Each first contact structure C1 may include a silicon region 309, a first metal-silicon region 310, a first barrier 314, and a first metal region 311.

The second contact structures C2 may be the same as the second contact structure C2 according to the first embodiment. For example, each second contact structure C2 may be formed in a second opening 307 including sidewall spacers 308. The second opening 307 may be formed in a second dielectric layer 307A and exposes a portion of the third doping region 305. Each second contact structure C2 may include a second metal-silicon region 312, a second barrier 315, and a second metal region 313.

Referring to FIG. 5B, a semiconductor structure 300M in accordance with a modification of the third embodiment may include a first transistor Tr1, a second transistor Tr2, first contact structures C11 coupled to the first transistor Tr1, and second contact structures C12 coupled to the second transistor Tr2, The second contact structures C12 may be the same as the second contact structures C2 of FIG. 5A. The first contact structures C11 may be similar to the first contact structures C1 of FIG. 5A.

For example, each first contact structure C11 may be formed in a first opening 306 with no spacers. Each first contact structure C11 may include a silicon region 309, a first metal-silicon region 310, a first barrier 314, and a first metal region 311. Each first contact structure C11 may further include an interface doping region 316 between the silicon region 309 and the first metal-silicon region 310.

Figure 6A:
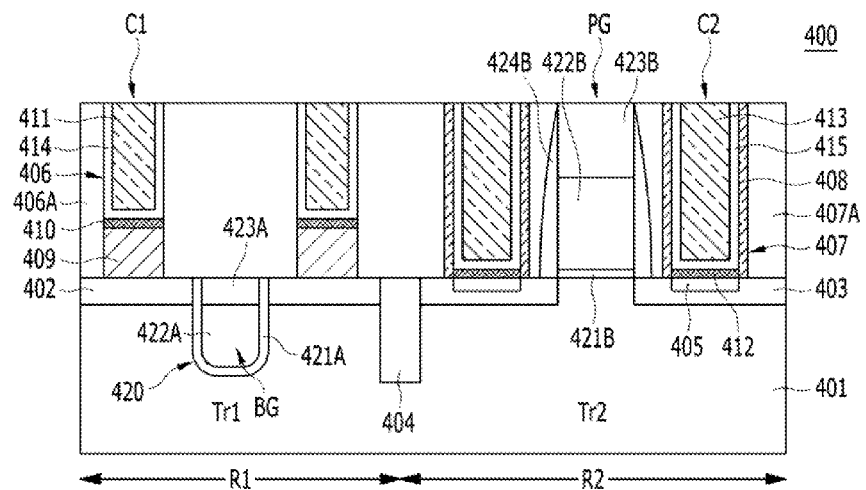
FIGS. 6A and 6B are views illustrating semiconductor structures in accordance with a fourth embodiment and a modification thereof.
Figure 6B:
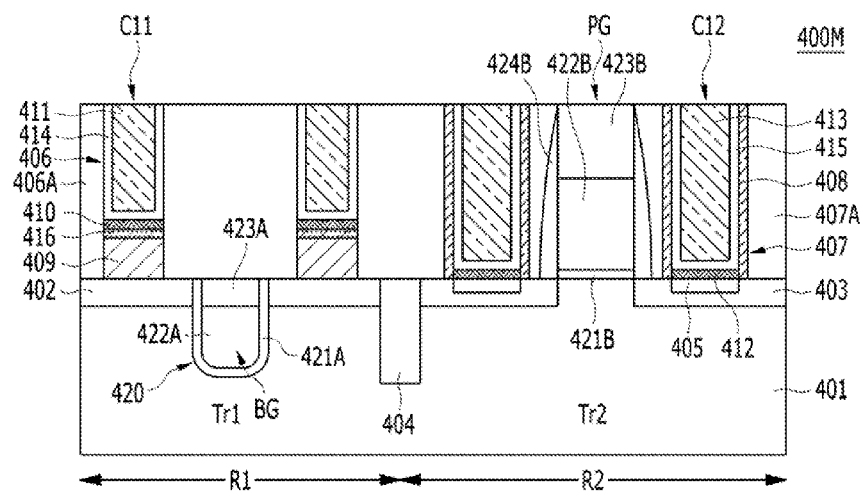

FIG. 6A is a view illustrating a semiconductor structure in accordance with a fourth embodiment. FIG. 6B is a view illustrating a semiconductor structure in accordance with a modification of the fourth embodiment.

Referring to FIG. 6A, a semiconductor structure 400 in accordance with a fourth embodiment may include a first transistor Tr1, a second transistor Tr2, first contact structures C1 coupled to the first transistor Tr1, and second contact structures C2 coupled to the second transistor Tr2.

The first transistor Tr1 may include a buried gate structure BG and a pair of first doping regions 402. The pair of first doping regions 402 may be respectively positioned in a substrate 401 and at both sides of the buried gate structure BG. The first contact structures C1 may be coupled to the pair of first doping regions 402, respectively. The buried gate structure BG may include a first gate dielectric layer 421A, a first gate electrode 422A, and a first gate cap layer 423A. The buried gate structure BG may be formed in a gate trench 420. The pair of first doping regions 402 may be source and drain regions of the first transistor Tr1.

The second transistor Tr2 may include a planar gate structure PG and a pair of second doping regions 403. The pair of second doping regions 403 may be respectively positioned in the substrate 401 and at both sides of the planar gate structure PG. The second contact structures C2 may be coupled to the pair of second doping regions 403, respectively. The planar gate structure PG may include a second gate dielectric layer 421B, a second gate electrode 422B, and a second gate cap layer 423B. Gate spacers 424B may be formed on both sidewalls of the planar gate structure PG. The pair of second doping regions 403 may be source and drain regions of the second transistor Tr2. Third doping regions 405 may be formed in the second doping regions 403. The third doping regions 405 and the second contact structures C2 may contact each other.

The first transistor Tr1 and the second transistor Tr2 may be isolated by an isolation layer 404. The first transistor Tr1 and the second transistor Tr2 may be the same type or different types. For example, both the first transistor Tr1 and the second transistor Tr2 may be NMOSFETs or PMOSFETs. Further, any one transistor of the first transistor Tr1 and the second transistor Tr2 may be an NMOSFET, and the other transistor may be a PMOSFET. When the transistors Tr1 and Tr2 have different polarity from each other, the first doping regions 402 and the second doping regions 403 may be doped with different dopants.

The first contact structures C1 may be the same as the first contact structure C1 according to the first embodiment. For example, each first contact structure C1 may be formed in a first opening 406 with no spacers. The first opening 406 may be formed in a first dielectric layer 406A and exposes a portion of the first doping region 402. Each first contact structure C1 may include a silicon region 409, a first metal-silicon region 410, a first barrier 414, and a first metal region 411.

The second contact structures C2 may be the same as the second contact structure C2 according to the first embodiment. For example, each second contact structure C2 may be formed in a second opening 407 including sidewall spacers 408. The second opening 407 may be formed in a second dielectric layer 407A and exposes a portion of the third doping region 405. Each second contact structure C2 may include a second metal-silicon region 412, a second barrier 415, and a second metal region 413.

Referring to FIG. 6B, a semiconductor structure 400M in accordance with a modification of the fourth embodiment may include a first transistor Tr1, a second transistor Tr2, first contact structures C11 coupled to the first transistor Tr1, and second contact structures C12 coupled to the second transistor Tr2. The second contact structures C12 may be the same as the second contact structures C2 of FIG. 6A. The first contact structures C11 may be similar to the first contact structures C1 of FIG. 6A. For example, each first contact structure C11 may be formed in a first opening 406 with no spacers. Each first contact structure C11 may include a silicon region 409, a first metal-silicon region 410, a first barrier 414, and a first metal region 411. Each first contact structure C11 may further include an interface doping region 416 between the silicon region 409 and the first metal-silicon region 410.

The fourth embodiment and the modification thereof may be applied to a CMOS. For example, a first transistor including a buried gate structure may be formed in a first region, and a CMOS may be formed in a second region. In other words, a CMOS includes an NMOS and a PMOS, and each of the NMOS and the PMOS include a planar gate structure and a second contact structure.

Figure 7A:
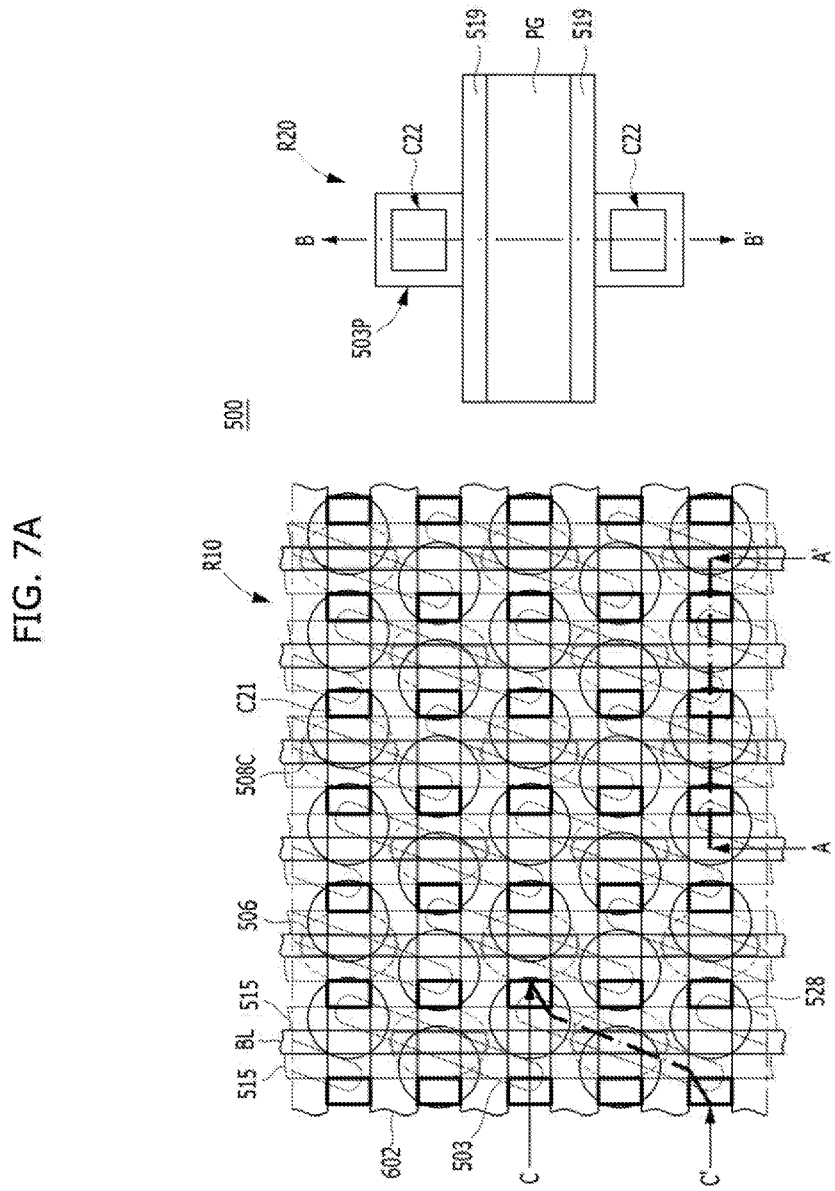
FIG. 7A is a view illustrating a semiconductor structure in accordance with a fifth embodiment.
Figure 7B:
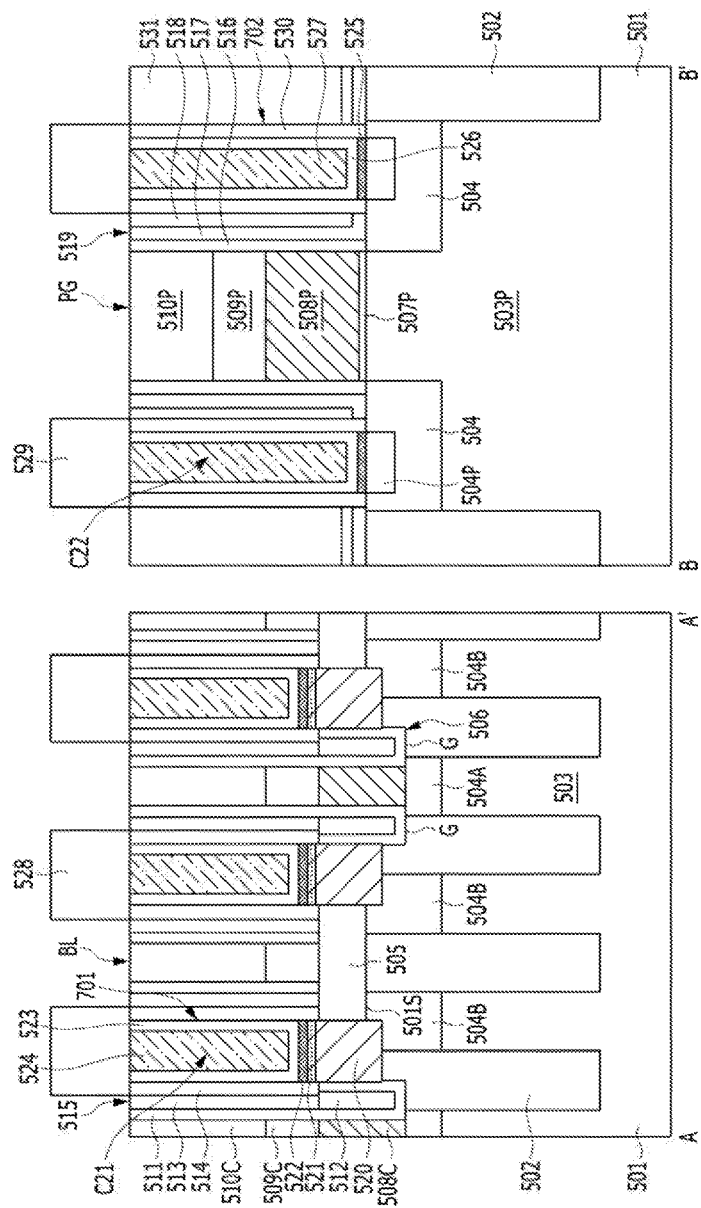
FIG. 7B is a cross-sectional view taken along the lines A-A' and B-B' of FIG. 7A.
Figure 7C:
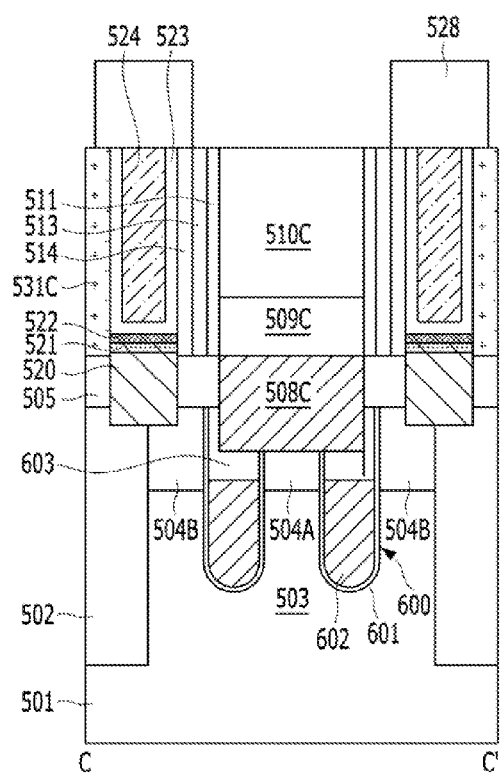
FIG. 7C is a cross-sectional view taken along the line C-C' of FIG. 7A.
Figure 7D:
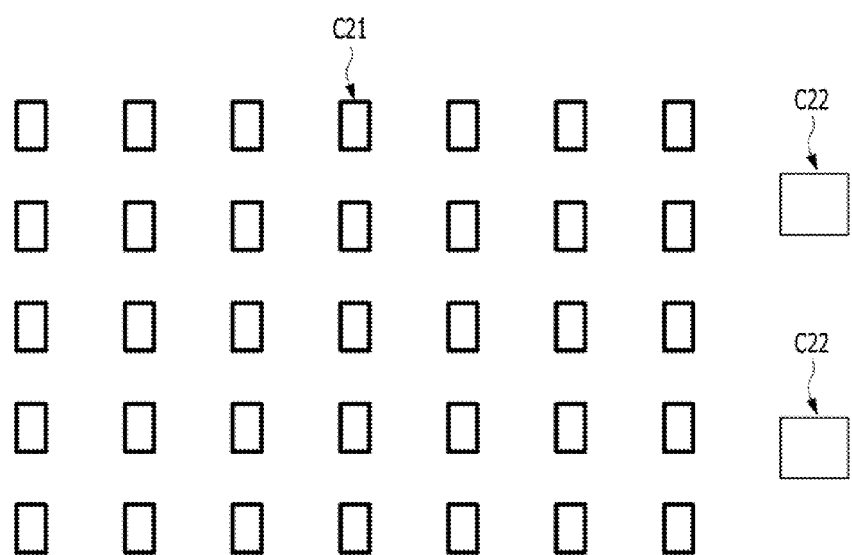
FIG. 7D is a view comparing a cell contact structure C21 and a peripheral contact structure C22.

FIG. 7A is a view illustrating a semiconductor structure in accordance with a fifth embodiment. In the fifth embodiment, contact plugs are applied in a semiconductor device having memory cells, such as a DRAM. FIG. 7B is a cross-sectional view taken along the lines A-A' and B-B' of FIG. 7A. FIG. 7C is a cross-sectional view taken along the line C-C' of FIG. 7A. FIG. 7D is a view comparing a cell contact structure C21 and a peripheral contact structure C22.

A semiconductor structure 500 may include a memory cell region R10 and a peripheral circuit region R20. A plurality of memory cells may be formed in the memory cell region R10. Each memory cell may include a buried word line 602, a bit line 509C, and a memory element 528. A transistor configuring a peripheral circuit (hereinafter, simply referred to as a 'peripheral transistor') may be formed in the peripheral circuit region R20. The peripheral transistor may include a planar gate structure PG. The semiconductor structure 500 will be described below in detail.

An isolation layer 502 is formed in a substrate 501. A plurality of active regions 503 are defined in the memory cell region R10 by the isolation layer 502. An active region 503P may be defined in the peripheral circuit region R20 by the isolation layer 502.

Gate trenches 600 are formed in the memory cell region R10. A first gate dielectric layer 601 is formed on the surface of each gate trench 600. A buried word line 602 is formed on the first gate dielectric layer 601 to partially fill the gate trench 600. A sealing layer 603 is formed on the buried word line 602. The sealing layer 603 may extend up to the same level as an upper surface of the substrate 501. An upper surface of the buried word line 602 may be located at a level lower than the upper surface of the substrate 501.

A pair of first doping regions 504A and 504B may be formed in each active region 503. The first doping regions 504A and 504B may be separated from each other by the gate trench 600. The first doping regions 504A and 504B may be referred to as a source region and a drain region. The buried word line 602 and the first doping regions 504A and 504B may become a buried gate type transistor. The buried gate type transistor may improve a short channel effect by the buried word line 602.

A pair of second doping regions 504 may be formed in the active region 503P. The second doping regions 504 may include a low concentration source/drain region and a high concentration source/drain region, respectively. Third doping regions 504P may be formed in the second doping regions 504. The planar gate structure PG may be formed on the active region 503P between the pair of second doping regions 504. The planar gate structure PG may include a second gate dielectric layer 507P, a silicon electrode 508P, a metal electrode 509P, and a gate cap layer 510P.

Bit line contact plugs 508C are formed on the substrate 501 in the memory cell region R10. Each bit line contact plug 508C may be coupled to any one first doping region 504A. Each bit line contact plug 508C is positioned in a first opening 506. The first opening 506 is formed in a hard mask layer 505. The hard mask layer 505 is formed on the substrate 501. The first opening 506 is a contact hole which exposes the first doping region 504A. The bottom surface of the bit line contact plug 508C may be located at a lower level than a top surface 501S of the substrate 501. The bit line contact plug 508C may be formed of polysilicon or metallic material. A portion of the bit line contact plug 508C may have a line width smaller than the diameter of the first opening 506. Thus, gaps G are formed on both sides of the bit line contact plug 508C. The gaps G are independently formed on both the sides of the bit line contact plug 508C. As a result, one bit line contact plug 508C and a pair of gaps G are positioned in each first opening 506. The pair of gaps G is separated from each other by the bit line contact plug 508C. The gaps G may be positioned between the bit line contact plug 508C and silicon plugs 520.

A bit line structure BL is formed on the bit line contact plug 508C. The bit line structure BL includes a bit line 509C and a bit line cap layer 510C which is on the bit line 509C. The bit line structure BL has a line shape which extends in a direction intersecting with the buried word line 602. A portion of the bit line 509C is coupled with the bit line contact plug 508C. When viewed from the cross-section taken along the line A-A', the bit line 509C and the bit line contact plug 508C may have the same line width. Therefore, the bit line 509C may extend in any one direction while covering the bit line contact plug 508C. The bit line 509C may include a metallic material. The bit line cap layer 510C may include a dielectric material. The bit line structure BL and the planar gate structure PG may be concurrently formed by using the same materials.

A cell contact structure C21 may be formed between neighboring bit line structures BL. The cell contact structure C21 is formed in a second opening 701. The cell contact structure C21 may be coupled to one of the pair of first doping regions 504B. The cell contact structure C21 may include the silicon plug 520 and a first metal plug 524. The first metal plug 524 may neighbor the bit line 509C. The silicon plug 520 may neighbor the bit line contact plug 508C.

A plug isolation layer 531C may be formed between neighboring cell contact structures C21. The plug isolation layer 531C may be formed between neighboring bit line structures BL and provide the second opening 701.

The cell contact structure C21 may include the silicon plug 520, an interface doping region 521, a first metal silicide 522, a first barrier 523, and the first metal plug 524. The silicon plug 520 may include a doped polysilicon, and the first metal plug 524 may include tungsten. The first metal silicide 522 is formed between the silicon plug 520 and the first metal plug 524. The first metal silicide 522 is an ohmic contact layer. A contact resistance is decreased by the first metal silicide 522. The contact resistance may be further improved by the interface doping region 521. The interface doping region 521 may be a higher concentration than the dopant doped into the silicon plug 520. In another embodiment, the interface doping region 521 may be omitted.

Peripheral contact structures C22 may be formed in the peripheral circuit region R20. Each peripheral contact structure C22 may fill a third opening 702 in an interlayer dielectric layer 531. The peripheral contact structure C22 may include a second metal silicide 525, a second barrier 526, and a second metal plug 527. The second barrier 526 may be concurrently formed with the first barrier 523. The second metal plug 527 may be concurrently formed with the first metal plug 524. The second metal silicide 525 may be concurrently formed with the first metal silicide 522. A metal line 529 may be formed on the peripheral contact structure C22. The third opening 702 may include sidewall spacers 530. The second metal silicide 525 may be coupled to the third doping region 504P. In this structure, the contact resistance of the peripheral contact structure C22 may be improved.

A memory element 528 may be formed on the cell contact structure C21. The memory element 528 may include a capacitor which includes a storage node. The storage node may include a pillar type. While not shown, a dielectric layer and a plate node may be additionally formed on the storage node. The storage node may include a cylinder type or a pillar type. In another embodiment, a memory element realized in a variety of ways may be coupled to the cell contact structure C21. In the case where the memory element 528 includes a storage node, the cell contact structure C21 may be referred to as a storage node contact plug.

First spacer elements 515 may be formed on the sidewalls of the bit line structure BL. Second spacer elements 519 may be formed on the sidewalls of the planar gate structure PG. The first spacer element 515 may include a first spacer 511, a second spacer 512, a third spacer 513, and a fourth spacer 514. The second spacer element 519 may include a fifth spacer 516, a sixth spacer 517, and a seventh spacer 518. Second spacers 512 may be filled in the gaps G on both sides of the bit line contact plug 508C.

As shown in FIG. 7D, cell contact structures C21 may be formed as a high density array. The peripheral contact structures C22 may be formed with a low density. The cell contact structure C21 and the peripheral contact structure C22 may be same with or different from each other in structure. For example, the cell contact structure C21 and the peripheral contact structure C22 may have the same height and different widths. The peripheral contact structure C22 may have a width larger than the cell contact structure C21.

According to the above descriptions, cell contact structures C21 are formed in second openings 701 and has a spacer-free structure formed in the memory cell region R10. Peripheral contact structures C22 are formed in third openings 702 and includes sidewall spacers 530 formed in the peripheral circuit region R20.

FIGS. 8A to 8M illustrates a method for forming the semiconductor structure in accordance with the fifth embodiment.

In the following descriptions, in a DRAM, in addition to a memory cell region where memory cells are formed, a peripheral circuit region for controlling input and output of data from and to the memory cells may be disposed. When pluralities of elements are formed in the memory cell region and the peripheral circuit region, some elements may be formed concurrently.

As shown in FIG. BA, an isolation layer 42 is formed in a substrate 41. The substrate 41 may include a memory cell region R10 and a peripheral circuit region R20. The isolation layer 42 may be formed through an STI process. Active regions 43 are defined in the memory cell region R10 by the isolation layer 42. The active regions 43 may be an island type which has a minor axis and a major axis. A plurality of active regions 43 are isolated by the isolation layer 42. The isolation layer 42 may include a silicon nitride, a silicon oxide, or a combination thereof. The memory cell region R10 and the peripheral circuit region R20 may be isolated from each other by the isolation layer 42.

The isolation layer 42 formed in the memory cell region R10 and the isolation layer 42 formed in the peripheral circuit region R20 may have different widths. For example, a width of the isolation layer 42 formed in the peripheral circuit region R20 may be larger. The active region 43 formed in the memory cell region R10 and an active region 43P formed in the peripheral circuit region R20 may have different sizes. For example, the active region 43P formed in the peripheral circuit region R20 may be larger. The active regions 43 formed in the memory cell region R10 may be formed with a high density. Active regions 43P formed in the peripheral circuit region R20 may be formed with a lower density than the memory cell region R10.

While not shown, as shown in FIG. 7C, buried gate type transistors each including a first gate dielectric layer (see the reference numeral 601 of FIG. 7C), a buried word line (see the reference numeral 602 of FIG. 7C) and a sealing layer (see the reference numeral 603 of FIG. 7C) may be formed in the memory cell region R10.

Next, a plurality of first doping regions 44A and 44B may be formed in the active regions 43 of the memory cell region R10. First doping regions 44A and 44B correspond to source regions and drain regions. Any one first doping region 44A is a part to which a bit line is to be coupled, and the other first doping region 448 is a part to which a memory element is to be coupled.

Then, a hard mask layer 45 may be formed. The hard mask layer 45 may include a silicon oxide. The hard mask layer 45 may include TEOS. The hard mask layer 45 may be a material which has been used as an etch barrier in a process for forming gate trenches and buried word lines.

The hard mask layer 45 may be selectively removed from the peripheral circuit region R20. Thus, the surface of the substrate 41 in the peripheral circuit region R20 may be exposed. In order to selectively remove the hard mask layer 45, the memory cell region R10 may be masked. The hard mask layer 45 may remain in the memory cell region R10.

A second gate dielectric layer 46 may be formed on the substrate 41 in the peripheral circuit region R20. The second gate dielectric layer 46 may be formed through thermal oxidation. In another embodiment, the second gate dielectric layer 46 may be formed through chemical vapor deposition (CVD) or atomic layer deposition (ALD). The second gate dielectric layer 46 may include a high-k material, an oxide, a nitride, an oxynitride, or a combination thereof. A high-k material may be a dielectric material which has a dielectric constant higher than dielectric constants of an oxide and a nitride. For example, a high-k material may be metal oxides such as a hafnium oxide and an aluminum oxide. In the case where a high-k material is applied as the second gate dielectric layer 46, an interface layer may be additionally formed under the high-k material.

First contact holes 47 may be formed in the memory cell region R10. In order to form the first contact holes 47, the hard mask layer 45 may be etched using a contact mask (not shown). When viewed from the top, the first contact holes 47 may have a circular shape or an elliptical shape. Portions of the substrate 41 are exposed by the first contact holes 47. The first contact holes 47 may have a diameter that is controlled to have a predetermined line width. Each of the first contact holes 47 may be a type which exposes a portion of the active region 43. For example, the first doping regions 44A are exposed by the first contact holes 47. Each of the first contact holes 47 has a diameter that is larger than the width of the minor axis of the active region 43. Thus, in an etching process for forming the first contact holes 47, portions of the first doping regions 44A and the isolation layer 42 may be etched. Namely, the first doping regions 44A and the isolation layer 42 may be recessed to a predetermined depth in the first contact holes 47. According to this fact, the first contact holes 47 may be enlarged at the bottoms thereof.

Pre-plugs 47A are formed. A method for forming the pre-plugs 47A is as follows. First, a first conductive layer 47B which fills the first contact holes 47 is formed on the entire surface of the substrate 41 including the first contact holes 47. The first conductive layer 47B may be formed in both the memory cell region R10 and the peripheral circuit region R20. Next, the first conductive layer 47B may be selectively etched in the memory cell region R10. For example, the first conductive layer 47B may be etched in such a manner that the surface of the hard mask layer 45 is exposed. As a result, the pre-plugs 47A which fill the first contact holes 47 are formed. The surfaces of the pre-plugs 47A may be coplanar to the hard mask layer 42. In another embodiment, the pre-plugs 47A may have an upper surface which is located at a lower level than an upper surface of the hard mask layer 42. Subsequently, the pre-plugs 47A is doped by a doping process such as implantation. In the present embodiment, the pre-plugs 47A may include a polysilicon. In another embodiment, the pre-plugs 47A may be formed of a metal-containing material. The pre-plugs 47A may be formed in the memory cell region R10, and the first conductive layer 47B may remain on the second gate dielectric layer 46 in the peripheral circuit region R20.

Figure 8A:
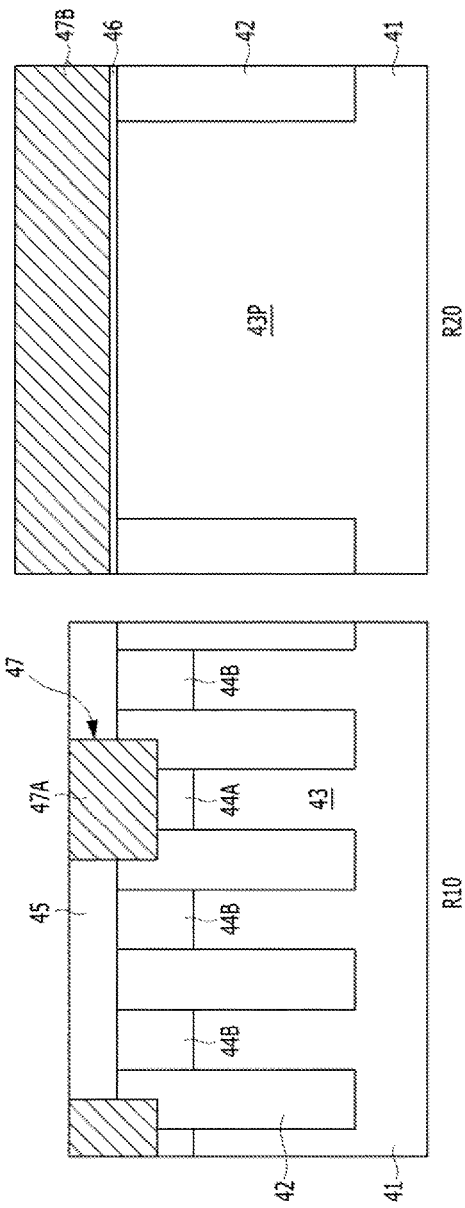
FIGS. 8A to 8M are illustrating a method for forming the semiconductor structure in accordance with the fifth embodiment.
Figure 8B:
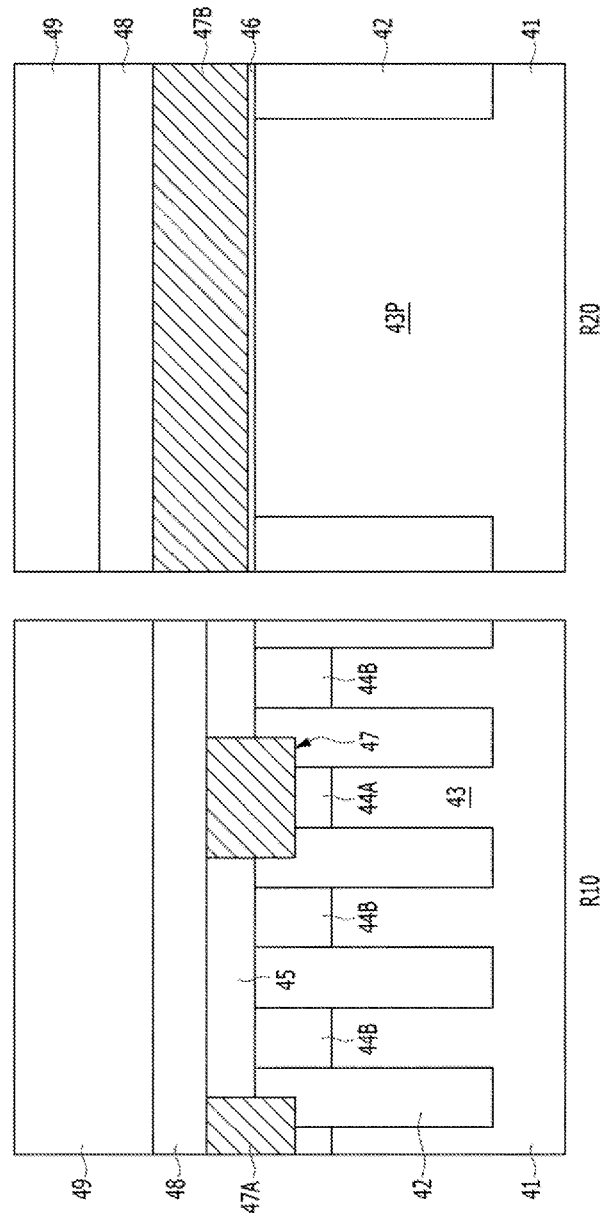

As shown in FIG. 8B, a second conductive layer 48 and a capping layer 49 may be stacked. The second conductive layer 48 and the capping layer 49 may be sequentially stacked on the pre-plugs 47A, the first conductive layer 47B and the hard mask layer 45. The second conductive layer 48 and the capping layer 49 may be concurrently formed in the memory cell region R10 and the peripheral circuit region R20. The second conductive layer 48 includes a metal-containing material. The second conductive layer 48 may include a metal, metal nitride, metal silicide, or a combination thereof. In the present embodiment, the second conductive layer 48 may include tungsten (W). In another embodiment, the second conductive layer 48 may include a stack of a titanium nitride and tungsten (TiN/W). The titanium nitride may play the role of a barrier. The capping layer 49 may be formed of a dielectric material which has an etching selectivity with respect to the second conductive layer 48 and the pre-plugs 47A. The capping layer 49 may include a silicon oxide or a silicon nitride. In the present embodiment, the capping layer 49 is formed of a silicon nitride.

Figure 8C:
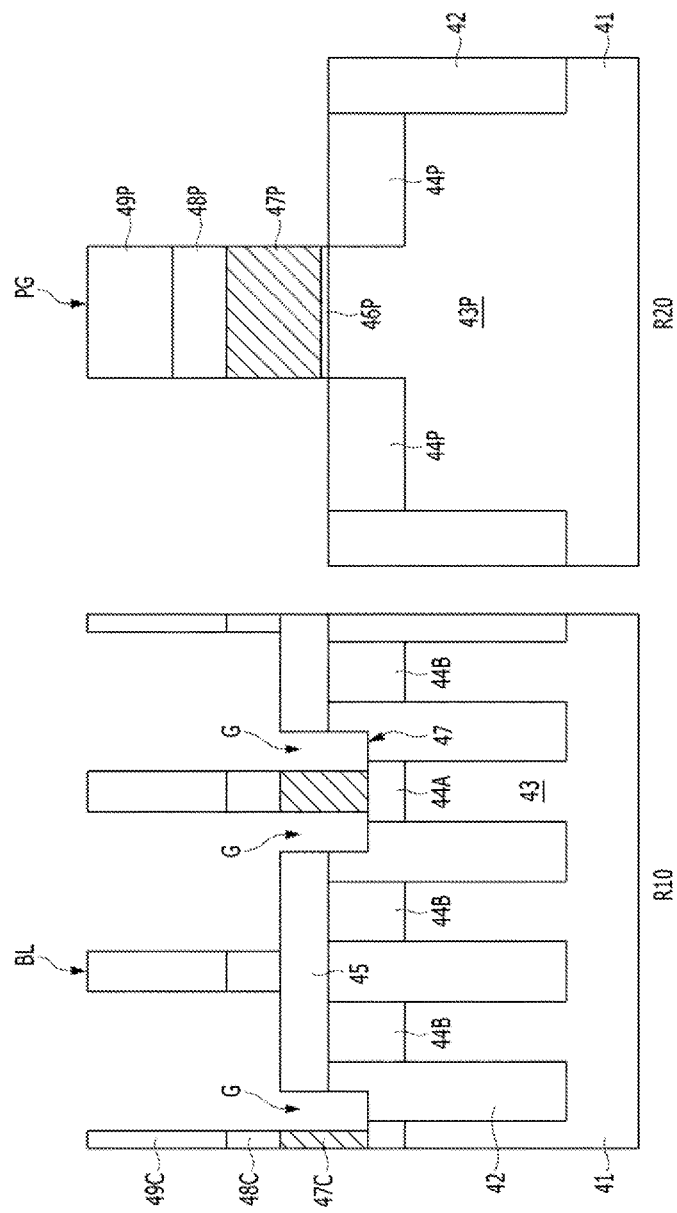

As shown in FIG. 8C, bit line structures BL and bit line contact plugs 47C are formed in the memory cell region R10. A planar gate structure PG may be formed in the peripheral circuit region R20. The bit line structures BL, the bit line contact plugs 47C and the planar gate structure PG may be concurrently formed. The bit line structures BL and the bit line contact plugs 47C may be formed by an etching process using a bit line mask. The planar gate structure PG may be formed by an etching process using a gate mask. The bit line mask and the gate mask may be formed at the same time.

The capping layer 49 and the second conductive layer 48 are etched by using the bit line mask as an etch barrier. As a result, the bit line structures BL including bit lines 48C and a bit line cap layer 49C are formed. The bit lines 48C may be formed by etching of the second conductive layer 48. The bit line cap layer 49C is formed by etching of the capping layer 49.

The pre-plugs 47A are etched to have the same line width as the bit lines 48C. As a result, the bit line contact plugs 47C are formed. The bit line contact plugs 47C are formed on the first doping regions 44A. The bit line contact plugs 47C couples the first doping regions 44A and the bit lines 48C. The bit line contact plugs 47C are formed in the first contact holes 47. The line width of the bit line contact plugs 47C is smaller than the diameter of the first contact holes 47. Accordingly, gaps G are formed on both sides of the bit line contact plugs 47C.

As described above, the gaps G are formed in the first contact holes 47 as the bit line contact holes 47C are formed. This is because the bit line contact plugs 47C have a line width smaller than the diameter of the first contact holes 47. The gaps G do not have surrounding shapes which surround the bit line contact plugs 47C, but are independently formed on both sides of the bit line contact plugs 47C. As a result, one bit line contact plug 47C and a pair of gaps G are positioned in each first contact hole 47, and the pair of gaps G are isolated from each other by the bit line contact plug 47C.

While forming the bit line structures BL and the bit line contact plugs 47C, the planar gate structure PG may be concurrently formed in the peripheral circuit region R20. The planar gate structure PG may include a second gate dielectric layer 46P, a silicon electrode 47P, a metal electrode 48P, and a gate cap layer 49P. The silicon electrode 47P is formed by etching the first conductive layer 47B, and the metal electrode 48P is formed by etching the second conductive layer 48. The gate cap layer 49P is formed by etching the capping layer 49. After etching of the first conductive layer 47B, the second gate dielectric layer 46 may be etched. Accordingly, the second gate dielectric layer 46P which is patterned may be positioned under the silicon electrode 47P.

Second doping regions 44P may be formed in the substrate 41 in the peripheral circuit region R20. The second doping regions 44P may be doped with a dopant at a low concentration, a high concentration or a combination thereof. In order to form the second doping regions 44P, the memory cell region R10 may be masked.

Figure 8D:
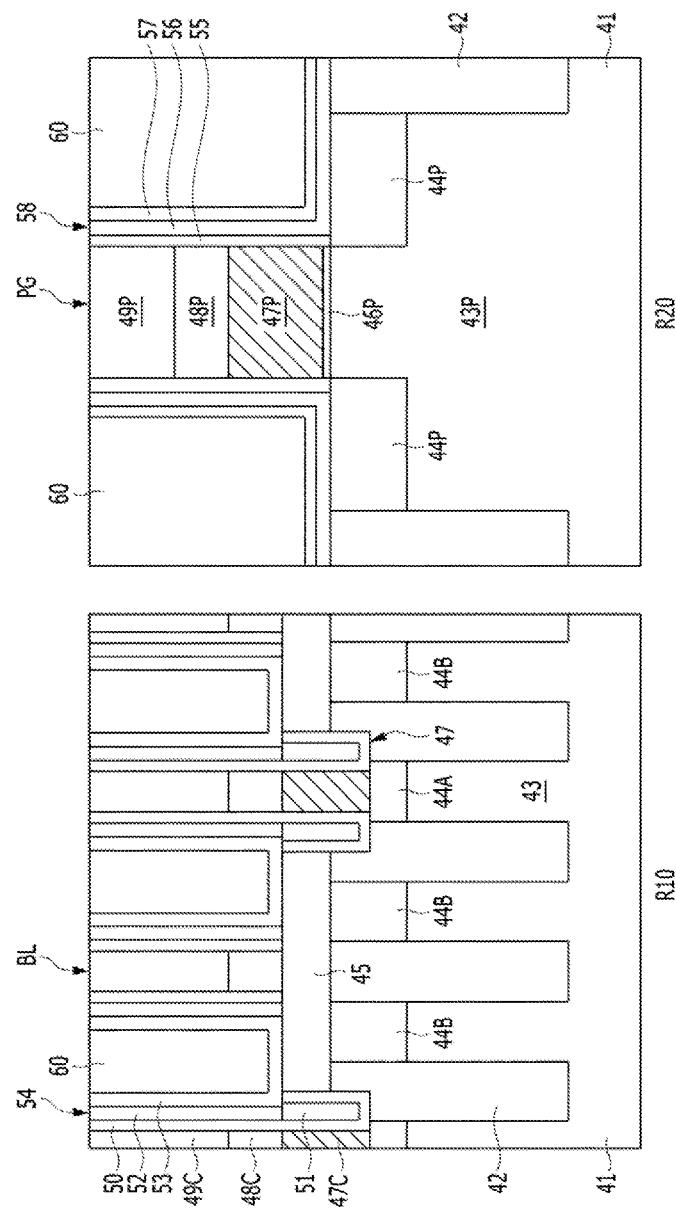

As shown in FIG. 8D, first spacer elements 54 and second spacer elements 58 may be formed. The first spacer elements 54 may be formed in the memory cell region R10, and the second spacer elements 58 may be formed in the peripheral circuit region R20. The first spacer elements 54 may be positioned on the sidewalls of the bit line contact plugs 47C and the bit line structures BL. The second spacer elements 58 may be formed on the sidewalls of the planar gate structure PG.

The first spacer elements 54 may be constructed by a plurality of spacers. For example, the first spacer elements 54 may include first spacers 50, second spacers 51, third spacers 52, and fourth spacers 53. The first spacers 50 may cover both sidewalls of the bit line structures BL and the bit line contact plugs 47C and cover the surfaces of the gaps G. The second spacers 51 may fill the gaps G on both sides of the bit line contact plugs 47C. The third spacers 52 may be positioned on both sidewalls of the bit line structures BL The fourth spacers 53 may cover the third spacers 52 and be positioned on the top of the hard mask layer 45.

The third spacers 52 and the fourth spacers 53 may not fill the gaps G. The first spacers 50, the second spacers 51 and the fourth spacers 53 may include a silicon nitride, and the third spacers 52 may include a silicon oxide. The second spacers 51 may be referred to as silicon nitride plugs.

The second spacer elements 58 may be constructed by a plurality of spacers. For example, the second spacer elements 58 may include fifth spacers 55, sixth spacers 56, and seventh spacers 57. The fifth spacers 55 may be formed only on the sidewalls of the planar gate structure PG. The sixth spacers 56 and the seventh spacers 57 may be formed on the sidewalls of the planar gate structure PG and cover the top surface of the substrate 41. The fifth spacers 55 and the seventh spacers 57 may include a silicon nitride, and the sixth spacers 56 may include a silicon oxide.

The first spacer elements 54 and the second spacer elements 58 may include spacers which are concurrently formed. In another embodiment, the first spacer elements 54 and the second spacer elements 58 may be formed in different processes. In another embodiment, the third spacers 52 may be referred to as sacrificial spacers. In a subsequent process, air gaps may be formed by removing the third spacers 52.

Next, an interlayer dielectric layer 60 is formed. The interlayer dielectric layer 60 is gapfilled between the bit line structures BL. The interlayer dielectric layer 60 includes a silicon oxide. The interlayer dielectric layer 60 may include a Spin On Dielectric (SOD). Subsequently, the interlayer dielectric layer 60 may be planarized such that the tops of the bit line structures BL are exposed. As a result, the interlayer dielectric layer 60 is formed between the bit line structures BL. The interlayer dielectric layer 60 may be parallel to the bit line structures BL. The interlayer dielectric layer 60 may also be formed in the peripheral circuit region R20. The interlayer dielectric layer 60 may be formed over the substrate 41 and on both sides of the planar gate structure PG.

Figure 8E:
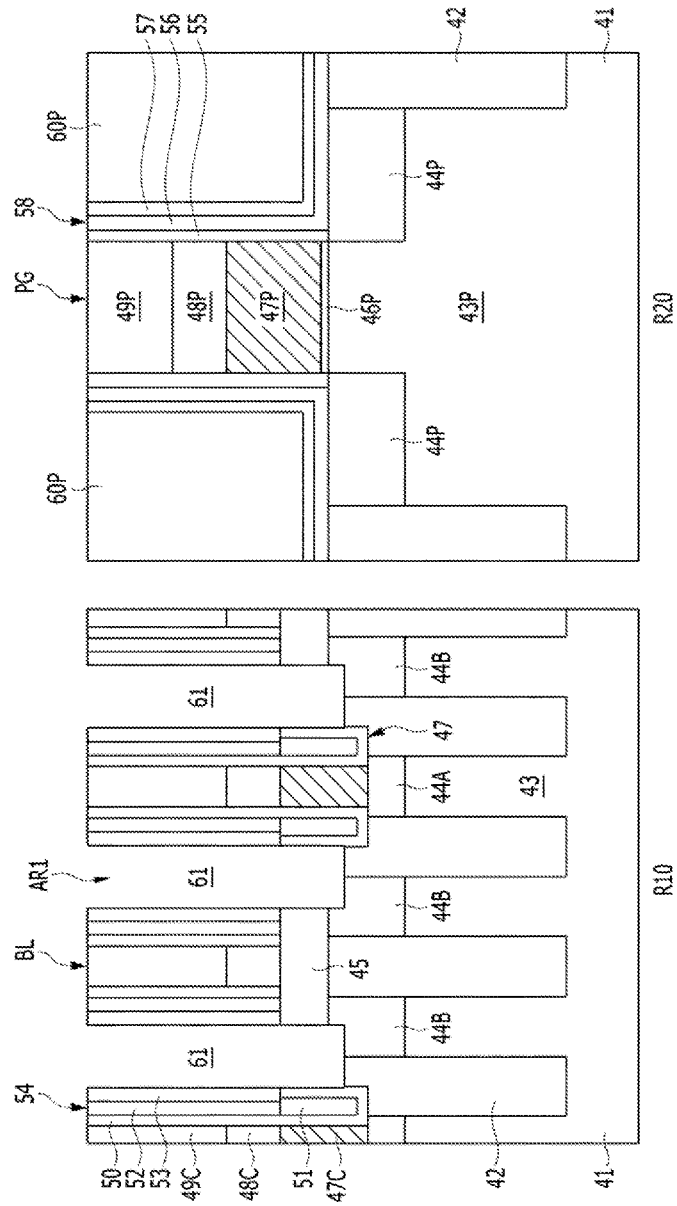

As shown in FIG. 8E, second contact holes 61 may be formed. The second contact holes 61 may be formed in the memory cell region R10. In order to form the second contact holes 61, the interlayer dielectric layer 60 may be removed from the memory cell region R10. In order to form the second contact holes 61, a damascene process may be applied. For example, plug isolation parts formed by partially etching portions of the interlayer dielectric layer 60 in the memory cell region R10. Thus, the remaining interlayer dielectric layer 60 may be include plug isolation parts. The plug isolation parts are formed between the bit line structures BL. A plug isolation layer (see the reference numeral 531C of FIG. 7C) is filled in the plug isolation parts. Then, by removing the remaining interlayer dielectric layer 60, the second contact holes 61 may be formed. The plug isolation layer may be formed by forming and then planarizing a silicon nitride. In order to remove the remaining interlayer dielectric layer 60 from the memory cell region R10, a dip-out process may be applied.

When viewed from the top, the second contact holes 61 may have a rectangular shape. An interlayer dielectric layer 60P may 10o remain in the peripheral circuit region R20. A size of each of the second contact holes 61 may be determined by the first spacer element 54, the plug isolation layer and the bit line structure BL. Since the fourth spacers 53, the plug isolation layer and the bit line cap layer 49C include silicon nitrides, the second contact holes 61 may include silicon nitride-based dielectric materials.

Next, the bottom portions of the second contact holes 61 are enlarged. To this end, the fourth spacers 53 are etched back. Then, the hard mask layer 45 is etched to be self-aligned with the fourth spacers 53. Accordingly, the first doping regions 44B are exposed on the bottoms of the second contact holes 61. Subsequently, portions of the first doping regions 44B and the isolation layer 42 may be recessed to a predetermined depth.

Each of the second contact holes 61 formed as described above may be a component corresponding to the first opening of the first embodiment and the second embodiment. The second contact holes 61 may have a first aspect ratio AR1.

Figure 8F:
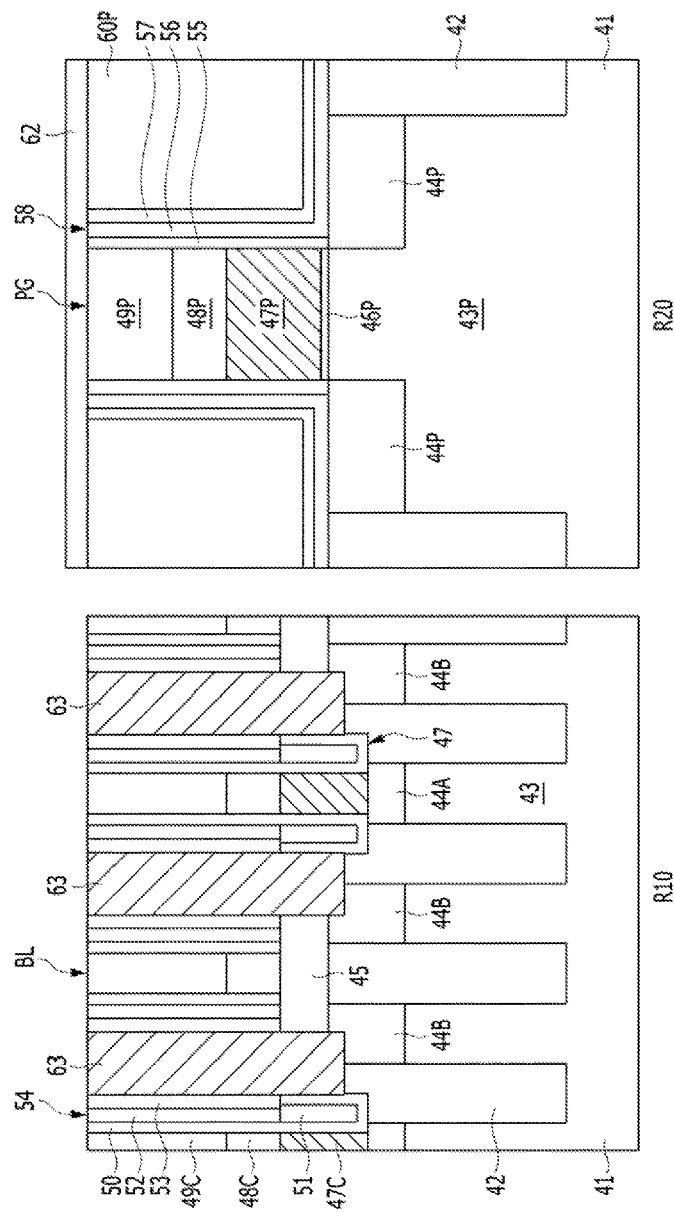

As shown in FIG. 8F, fillers 63 may be formed to fill the second contact holes 61. The fillers 63 may completely gapfill the second contact holes 61. The fillers 63 may be formed of a conductive material. For example, the fillers 63 may include a polysilicon. The fillers 63 may include a doped polysilicon doped with a dopant. The fillers 63 may be doped with phosphorus, arsenic or boron.

An example of forming the fillers 63 is as follows. First, a protective layer 62 is formed on the interlayer dielectric layer 60P. The protective layer 62 may cover the peripheral circuit region R20 and expose the memory cell region R10. The protective layer 62 may include a silicon nitride. Next, a polysilicon layer is filled in the second contact holes 61. The polysilicon layer may be exposed to a thermal process for activating the dopant implanted into the first doping regions 44B. Then, a planarization process such as chemical mechanical polishing (CMP) may be performed. The CMP process for the polysilicon layer may be performed until the surface of the protective layer 62 is exposed. As a result, the fillers 63 may be formed. The fillers 63 and the protective layer 62 may be coplanar to each other. The fillers 63 may be additionally removed to be positioned only in the second contact holes 61. In other words, by removing planar parts as in the first embodiment, the fillers 63 may be formed to have only filler parts. In this way, by using the polysilicon layer, it is possible to gapfill the second contact holes 61 without voids. In another embodiment, in order to form the fillers 63, gapfill and CMP processes for a polysilicon layer may be performed without forming the protective layer 62.

Figure 8G:
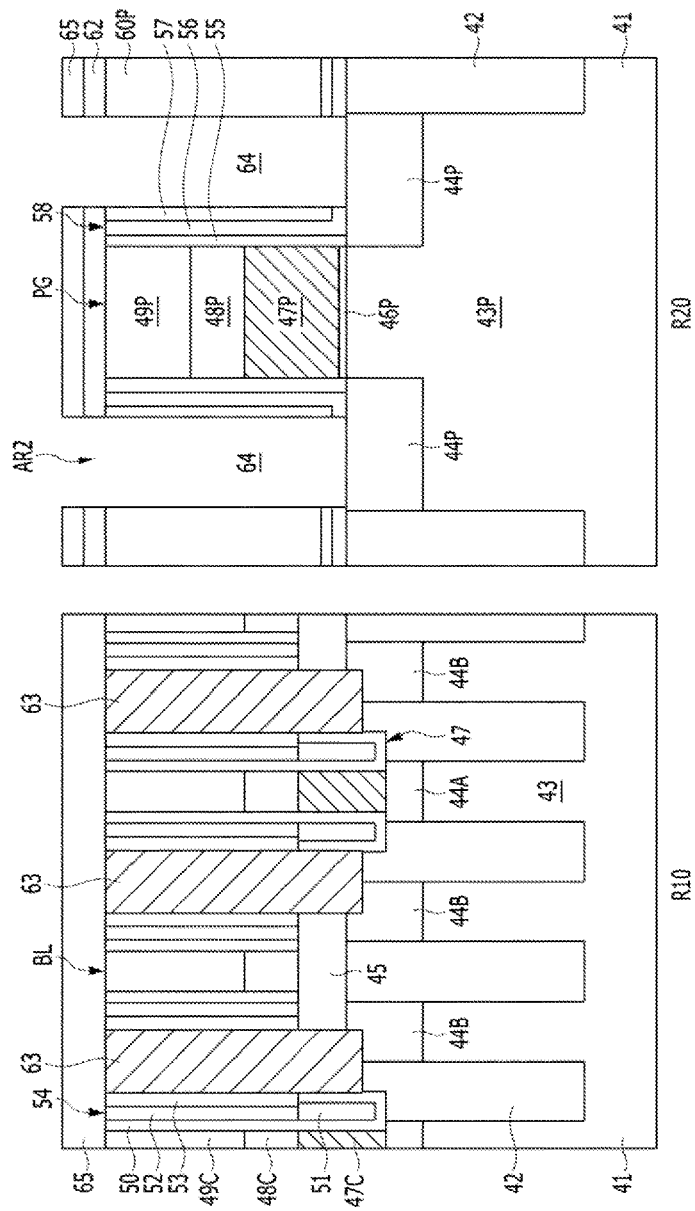

As shown in FIG. 8G, third contact holes 64 may be formed in the peripheral circuit region R20. The third contact holes 64 may be formed in the interlayer dielectric layer 60P. For example, in order to form the third contact holes 64, the protective layer 62 and the interlayer dielectric layer 60P may be etched. The third contact holes 64 may have a second aspect ratio AR2.

The first aspect ratio AR1 and the second aspect ratio AR2 may be the same as each other or different from each other. For example, the second contact holes 61 and the third contact holes 64 may have different and different widths. The third contact holes 64 may have a width larger than the second contact holes 61. The third contact holes 64 may expose the second doping regions 44P of the substrate 41. When viewed on the top, the third contact holes 64 may have a circular shape, an elliptical shape or a rectangular shape. While forming the third contact holes 64 in the peripheral circuit region R20, the memory cell region R10 may be protected by a mask layer 65. For the sake of convenience in explanation, the mask layer 65 will be referred to as a first mask layer 65. In another embodiment, the surfaces of the second doping regions 44P may be recessed. The first mask layer 65 may include a photoresist pattern. In another embodiment, the first mask layer 65 may be a hard mask material such as an SOC (Spin On Carbon), TEOS and an amorphous carbon.

Figure 8H:
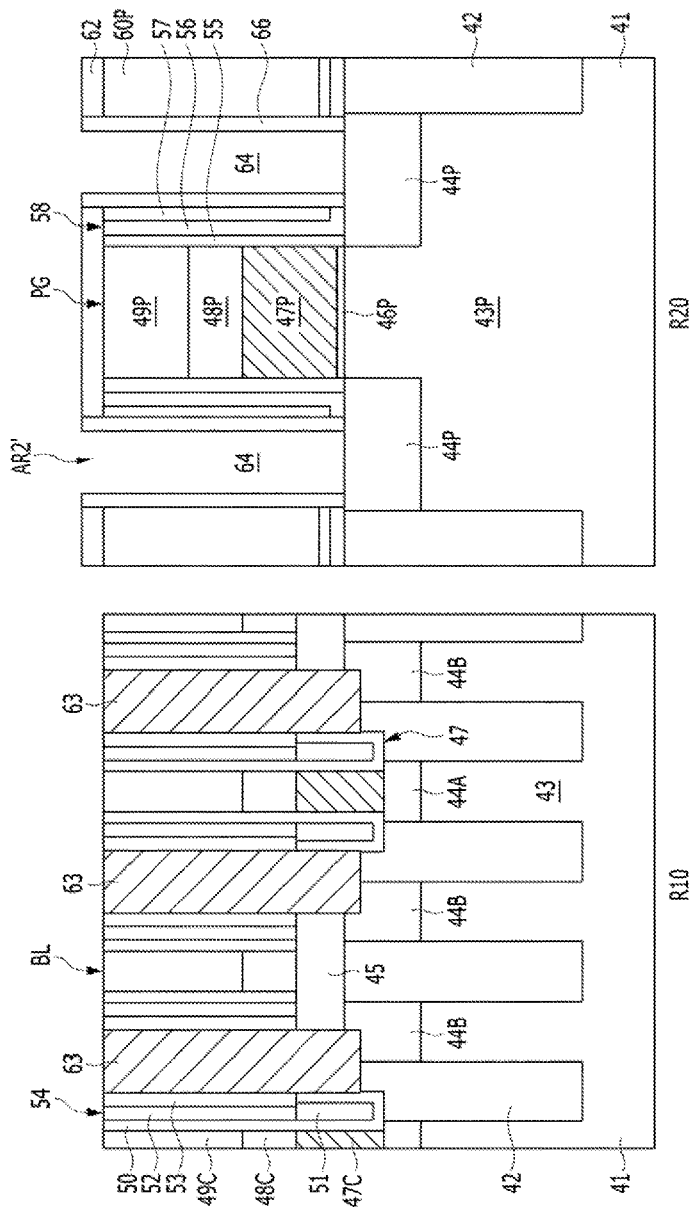

As shown in FIG. 8H, the first mask layer 65 may be removed. Sidewall spacers 66 may be formed in the third contact holes 64. The sidewall spacers 66 may have an etching selectivity with respect to the interlayer dielectric layer 60P. For example, when the interlayer dielectric layer 60P is formed of a silicon oxide, the sidewall spacers 66 may be formed of a silicon nitride. For example, when the interlayer dielectric layer 60P is formed of a silicon nitride, the sidewall spacers 66 may be formed of a silicon oxide. The sidewall spacers 66 are a material for preventing bowing from occurring in the upper sidewalls of the third contact holes 64. The sidewall spacers 66 are not formed in the memory cell region R10. The sidewall spacers 66 may expose the bottom surfaces of the third contact holes 64 and be formed only on the sidewalls of the third contact holes 64. During the etching process for forming the sidewall spacers 66, the second doping regions 44P of the substrate 41 may be recessed to a predetermined depth.

The sidewall spacers 66 may have a thickness of at least 30 Å. Thus, it is possible to firmly form the sidewall spacers 66 without bowing. When the thickness of the sidewall spacers 66 is thinner than 30 Å, the sidewall spacers 66 may be lost and bowing is likely to occur in the upper sidewalls of the third contact holes 64. If bowing occurs, bridging may occur between neighboring third contact holes 64.

The third contact holes 64 may have a corrected second aspect ratio AR2' due to the sidewall spacers 66. The corrected second aspect ratio AR2' may be larger than the initial second aspect ratio AR2.

Figure 8I:
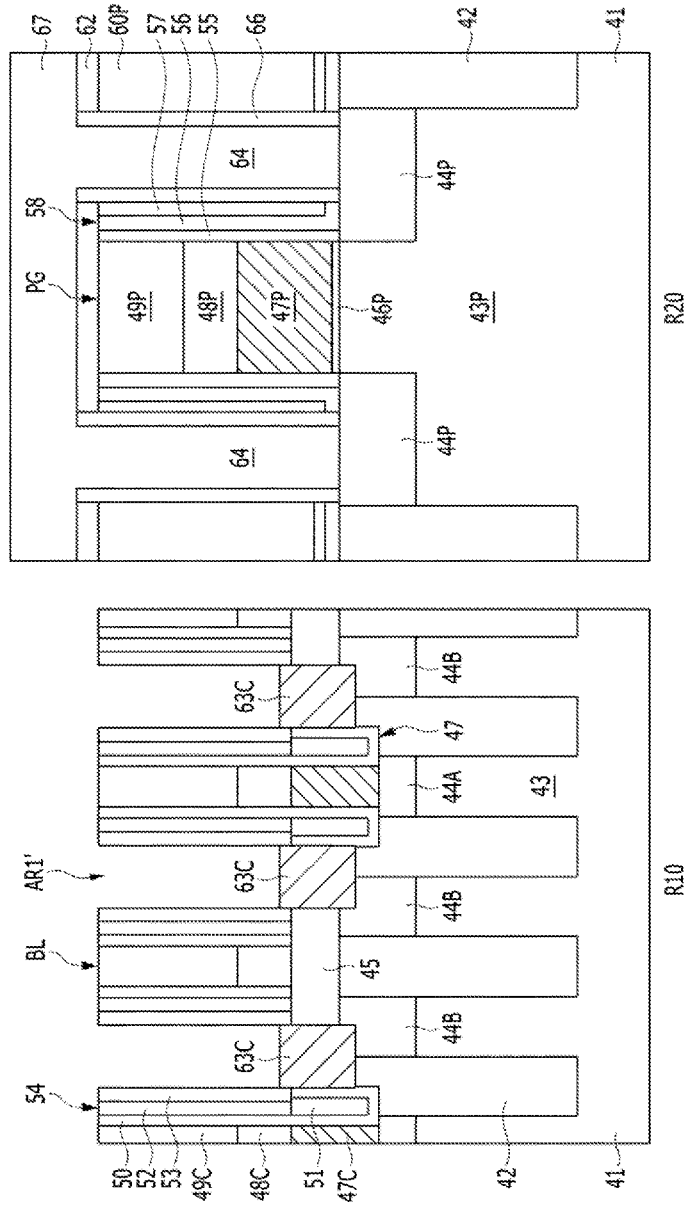

As shown in FIG. 8I, a blocking pattern 67 may be formed. The blocking pattern 67 may completely fill the third contact holes 64 and on the sidewall spacers 66. Moreover, the blocking pattern 67 may be removed from the memory cell region R10 such that it is formed only in the peripheral circuit region R20. The blocking pattern 67 may be formed of a carbon-containing material. The blocking pattern 67 may be formed by Spin on Coating. Thus, it is possible to void-freely fill the blocking pattern 67 in the third contact holes 64. The blocking pattern 67 may include an SOC (Spin On Carbon).

Then, the fillers 63 may be recessed so that its upper surface is located at a lower level than the top surfaces of the bit line structures BL. According to this fact, silicon regions, that is, silicon plugs 63C may be formed in the second contact holes 61. In order to recess the fillers 63, an etch-back process may be performed. Meanwhile, during the etch-back process, the peripheral circuit region R20 may be protected by the blocking pattern 67. Since the fillers 63 include a polysilicon, the silicon plugs 63C may be referred to as 'polysilicon plugs.'

The second contact holes 61 may have a corrected first aspect ratio AR1' due to the silicon plugs 63C. The corrected first aspect ratio AR1' may be smaller than the initial first aspect ratio AR1.

Figure 8J:
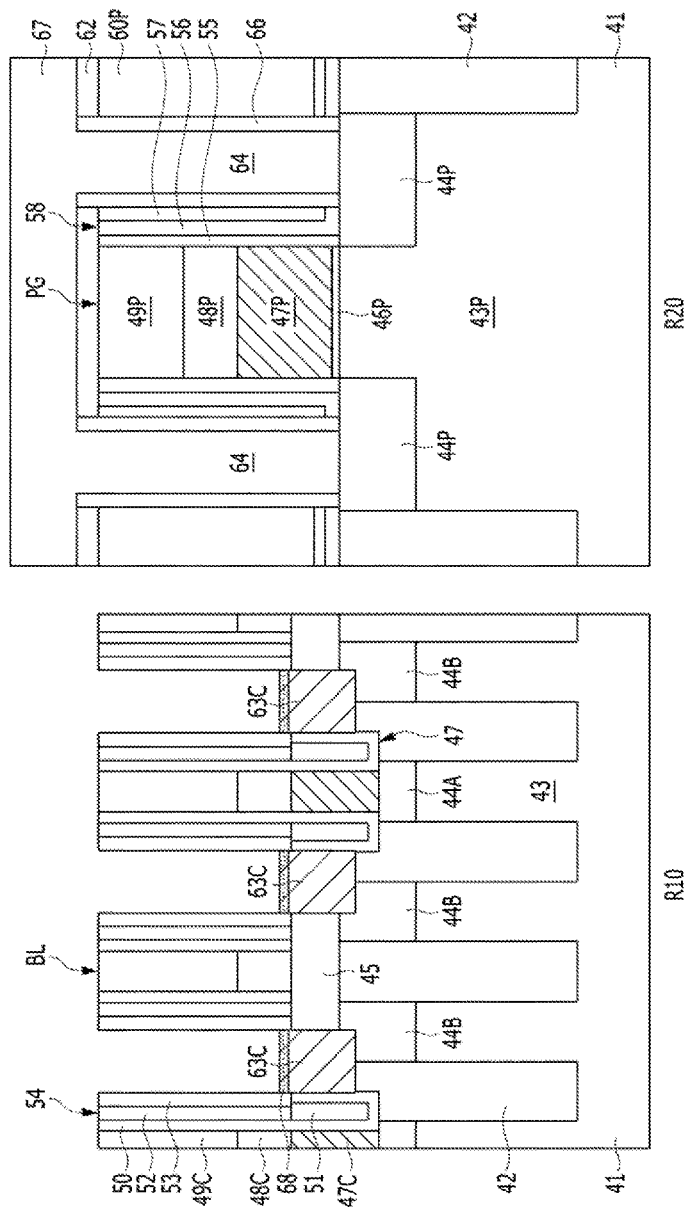

As shown in FIG. 8J, a dopant is implanted into the tops of the silicon plugs 63C. As a result, interface doping regions 68 may be formed. The interface doping regions 68 may be a higher doping concentration than the silicon plugs 63C. The interface doping regions 68 and the silicon plugs 63C may be doped with the same dopant. Next, a thermal processing for activating the dopant doped into the interface doping regions 68 may be performed.

Figure 8K:
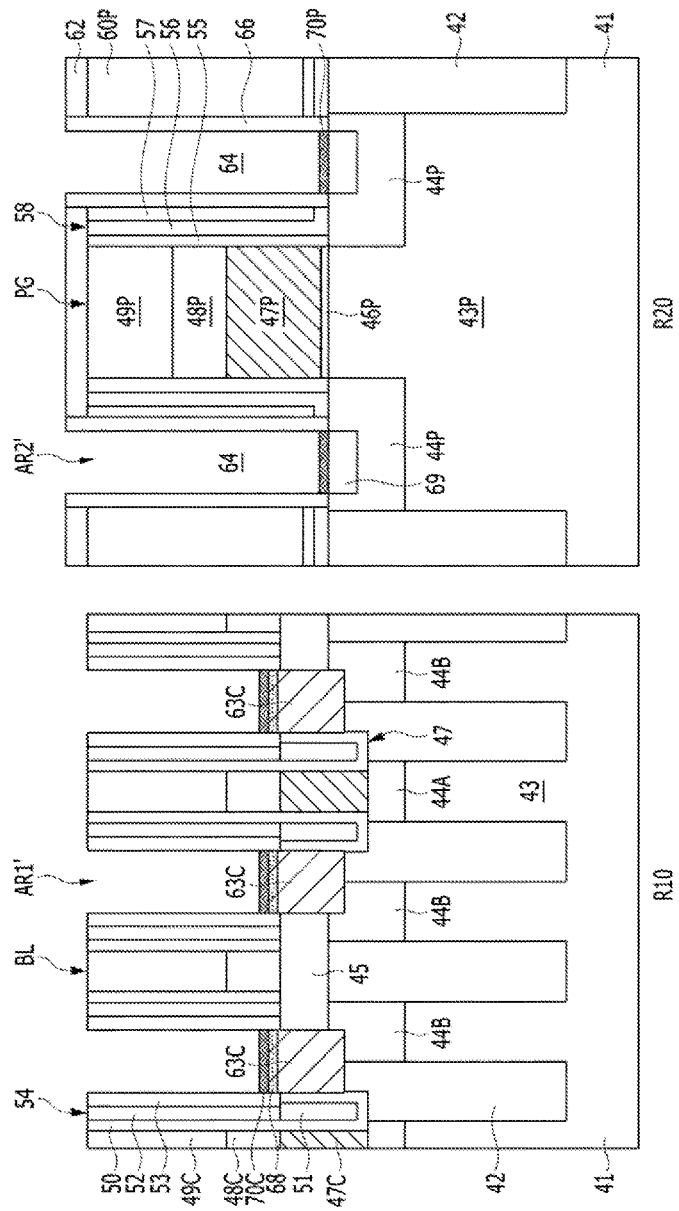

As shown in FIG. 8K, the blocking pattern 67 may be removed. The blocking pattern 67 may be removed by a strip process using oxygen plasma.

By the series of processes described above, the silicon plugs 63C may be formed in the memory cell region R10, and the sidewall spacers 66 may be formed in the peripheral circuit region R20. That is, the silicon plugs 63C may be partially filled in the second contact holes 61, and the sidewall spacers 66 may be formed on the sidewalls of the third contact holes 64. As a result, the second contact holes 61 may not include sidewall spacers, that is, a spacer-free structure. Sidewall spacers do not exist in the second contact holes 61, and the sidewall spacers 66 exist in the third contact holes 64.

The second contact holes 61 may have the corrected first aspect ratio AR1' smaller than the first aspect ratio AR1 due to the silicon plugs 63C. The third contact holes 64 may have the corrected second aspect ratio AR2' larger than the second aspect ratio AR2 due to the sidewall spacers 66. A difference between the corrected first aspect ratio AR1' and the original first aspect ratio AR1 may be larger than a difference between the corrected second aspect ratio AR2' and the original second aspect ratio AR2, The corrected first aspect ratio AR1' may be smaller than the corrected second aspect ratio AR2'.

Third doping regions 69 may be formed. The third doping regions 69 may be referred to as additional doping regions or interface doping regions. A contact resistance may be improved by the third doping regions 69. The third doping regions 69 may be formed in the second doping regions 44P. The third doping regions 69 may be formed in the peripheral circuit region R20. The third doping regions 69 may be formed by a doping technique such as implantation and plasma doping (PLAD). The third doping regions 69 may be doped with an N type dopant or a P type dopant. The second doping regions 44P and the third doping regions 69 may be doped with the same dopant or different dopants.

Next, by depositing a metal layer and performing a thermal process, first and second metal silicides 70C and 70P may be formed. The first metal silicides 70C may be formed in the second contact holes 61, and concurrently, the second metal silicides 70P may be formed in the third contact holes 64. The first and second metal silicides 70C and 70P may include a cobalt silicide.

The first metal silicides 70C may be formed on the interface doping regions 68. The second metal silicides 70P may be formed on the third doping regions 69. The first metal silicides 70C may be formed by reaction between silicon of the interface doping regions 68 and metal of the metal layer. The second metal silicides 70P may be formed be reaction of metal of the metal layer and silicon of the third doping regions 69.

After the thermal process, a non-reacted metal layer may be removed.

The first metal silicides 70C and the second metal silicides 70P are not limited to cobalt silicide. For example, by using another metal, for example, such as titanium and nickel, capable of forming a silicide by reacting with silicon, metal-silicides may be formed. In the case of concurrently forming the first metal silicides 70C and the second metal silicides 70P, a cobalt silicide which has a small amount of leakage current and a low resistance may be formed.

Figure 8L:
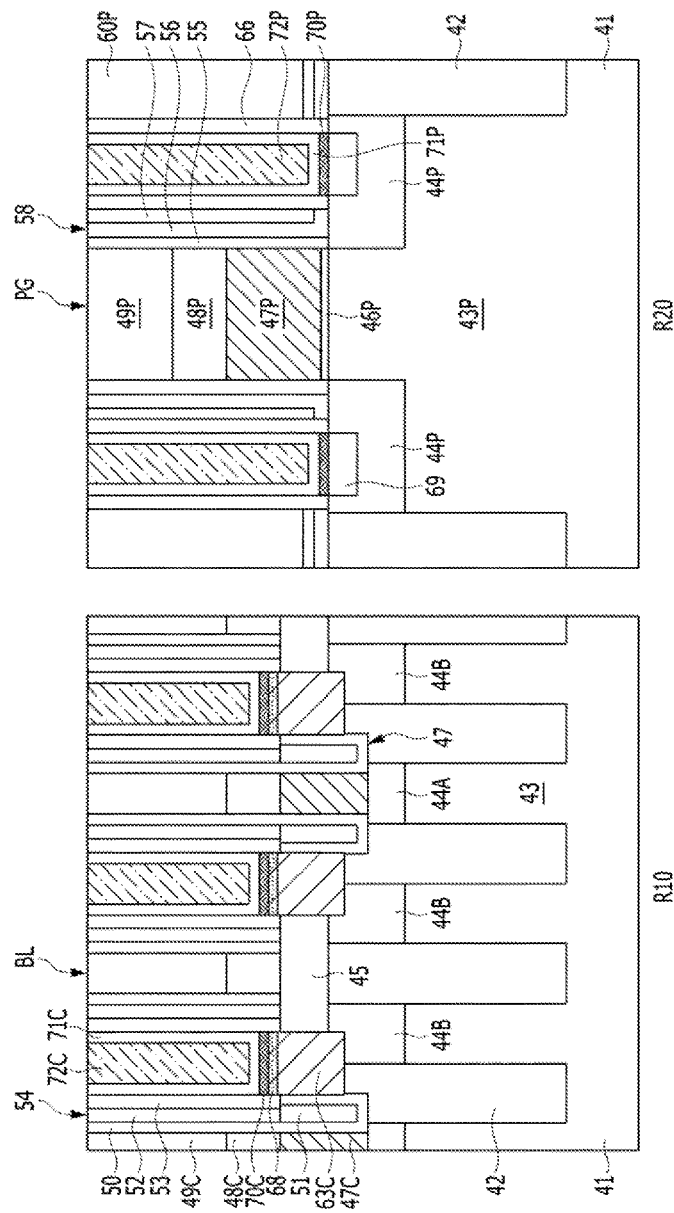

As shown in FIG. 8L, a conductive layer may be filled in the second contact holes 61 and the third contact holes 64, The conductive layer may be a material which has a resistance lower than the silicon plugs 63C. For example, the conductive layer may be a metallic material. After filling the conductive layer, a CMP process may be performed. First barriers 71C and first metal plugs 72C may be formed in the second contact holes 61. Second barriers 71P and second metal plugs 72P may be formed in the third contact holes 64. The first barriers 71C and the second barriers 71P may be concurrently formed, and the first metal plugs 72C and the second metal plugs 72P may also be concurrently formed. In the CMP process for forming the first metal plugs 72C and the second metal plugs 72P, the protective layer 62 may be removed.

According to the above descriptions, cell contact structures may be formed in the memory cell region R10, and peripheral contact structures may be formed in the peripheral circuit region R20, Each cell contact structure may include the silicon plug 63C, the interface doping region 68, the first metal silicide 70C, the first barrier 71C, and the first metal plug 72C. Each peripheral contact structure may include the second metal silicide 70P, the second barrier 71P, and the second metal plug 72P.

The cell contact structures and the peripheral contact structures may be asymmetrical to each other in structure. For example, the cell contact structures and the peripheral contact structures may become asymmetrical structures by the sidewall spacers 66 and the silicon plugs 63C. The cell contact structures may be spacer-free structures, and the peripheral contact structures may be spacer-embedded structures in which the sidewall spacers 66 are embedded. The cell contact structures include the silicon plugs 63C and the first metal plugs 72C whereas the peripheral contact structures include only the second metal plugs 72P.

Figure 8M:
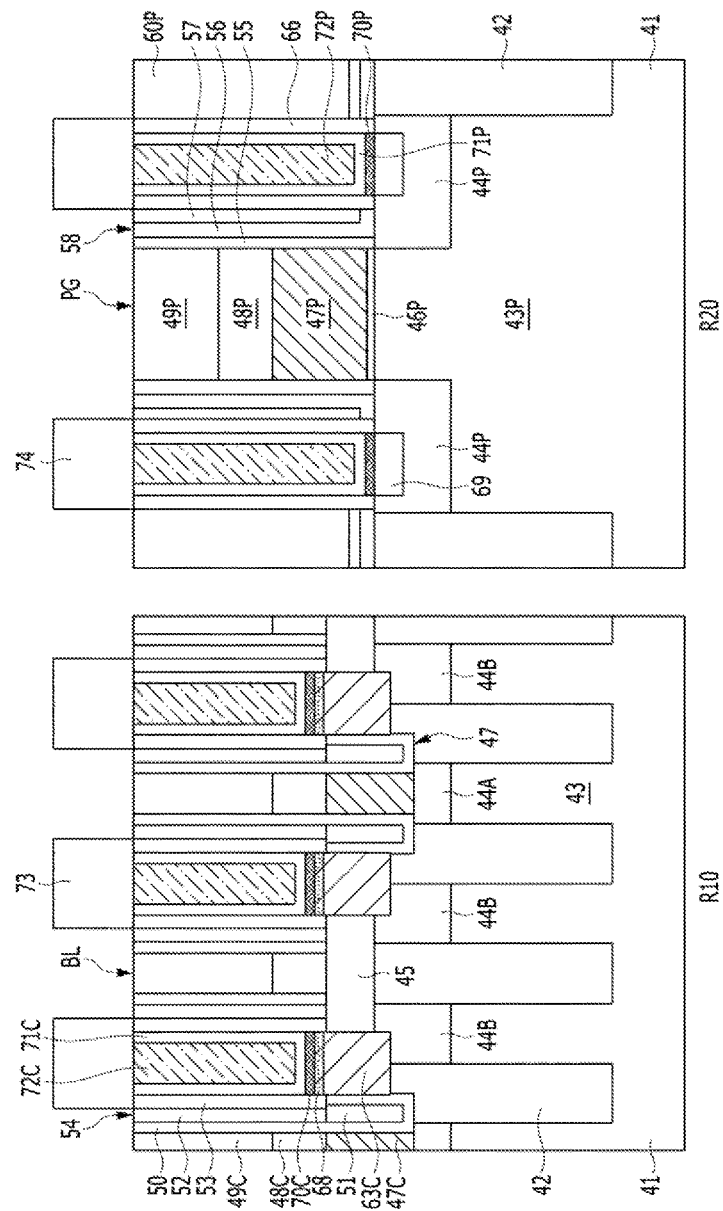

As shown in FIG. 8M, memory elements 73 may be formed on the first metal plugs 72C. The memory elements 73 may include capacitors. Metal lines 74 may be formed on the second metal plugs 72P.

FIGS. 9A to 9D illustrate a method for forming a semiconductor structure in accordance with a modification of the fifth embodiment. The first metal silicides 70C and the second metal silicides 70P may be formed by the method shown in FIGS. 8A to 8K.

Figure 9A:
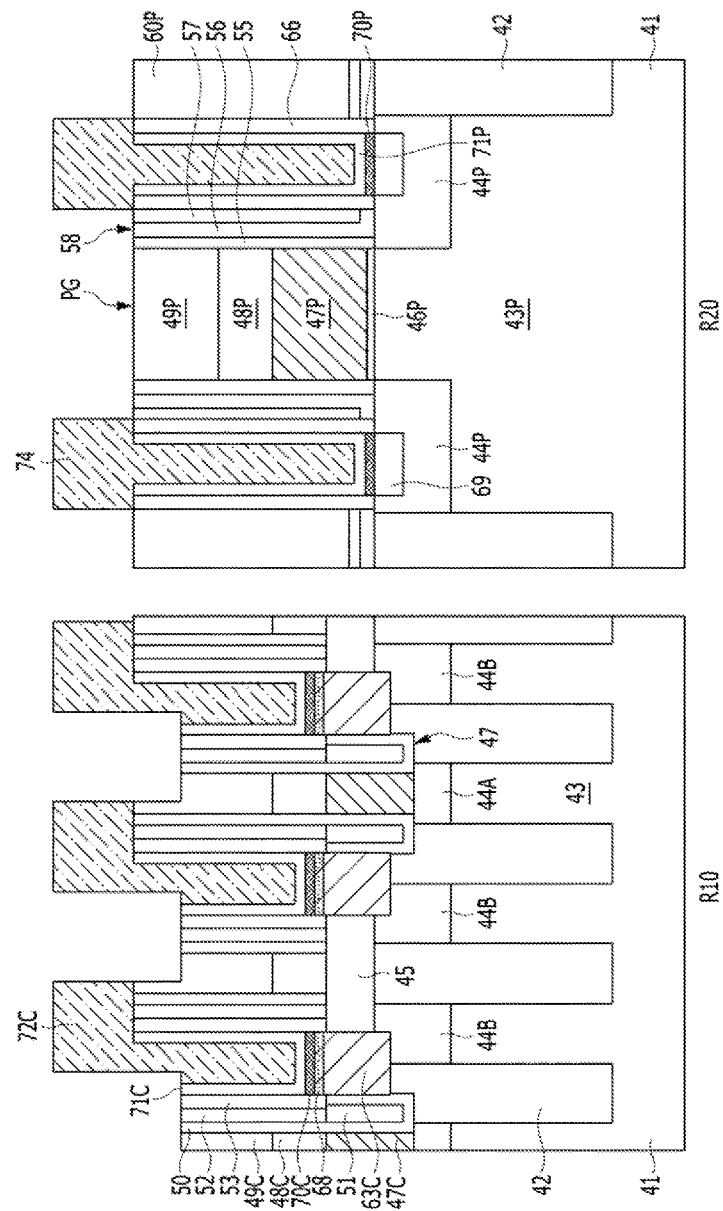
FIGS. 9A to 9D are illustrating a method for forming a semiconductor structure in accordance with a modification of the fifth embodiment.

Next, as shown in FIG. 9A, first barriers 71C and first metal plugs 72C are formed. The first metal plugs 72C may include extended parts which extend to the tops of bit line structures. Namely, the first metal plugs 72C may partially overlap with the bit line structures. In an etching process for forming the first metal plugs 72C, portions of the first spacer elements 54 may be etched. As a result, the third spacers 52 may be exposed.

While forming the first barriers 71C and the first metal plugs 72C, second barriers 71P and metal lines 74 may be concurrently formed in the peripheral circuit region R20. The metal lines 74 may be directly formed without using metal plugs. When viewed from the top, the metal lines 74 may be line shapes, and the first metal plugs 72C may dot shapes.

Figure 9B:
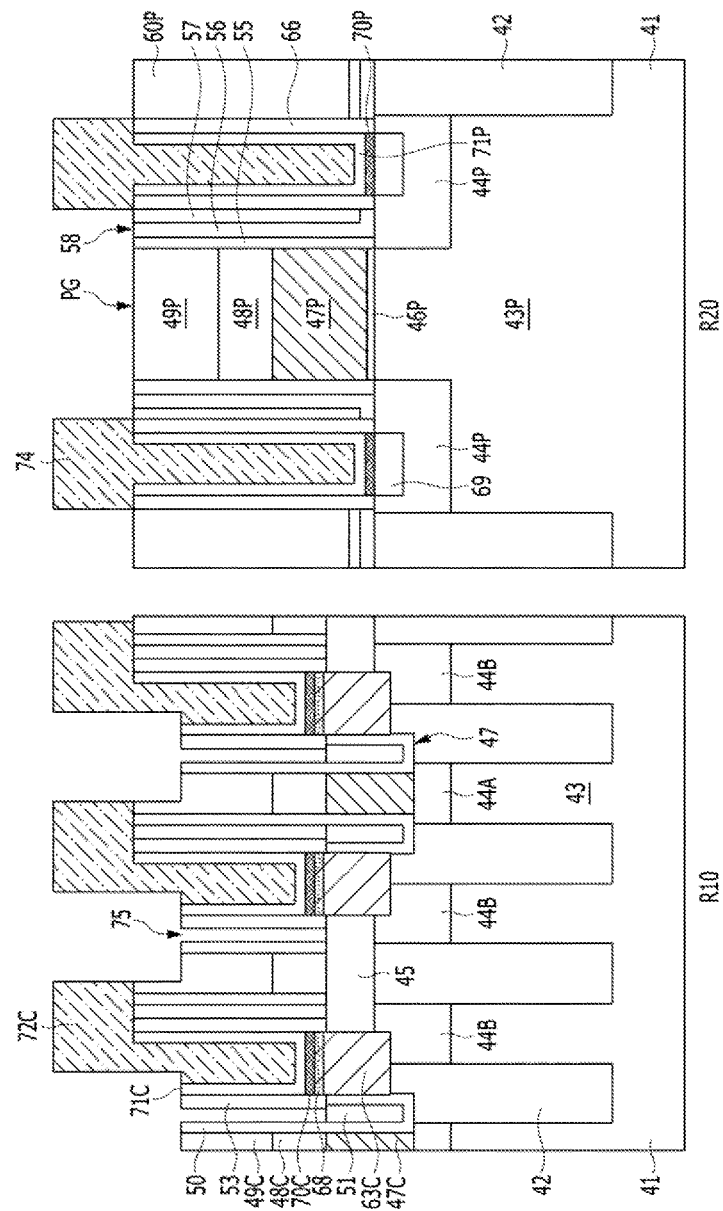

As shown in FIG. 9B, the third spacers 52 may be removed. As a result, air gaps 75 may be formed. The air gaps 75 may be line shapes which are parallel to both sidewalls of the bit line structures. The air gaps 75 may be formed between the first spacers 50 and the third spacers 53.

Figure 9C:
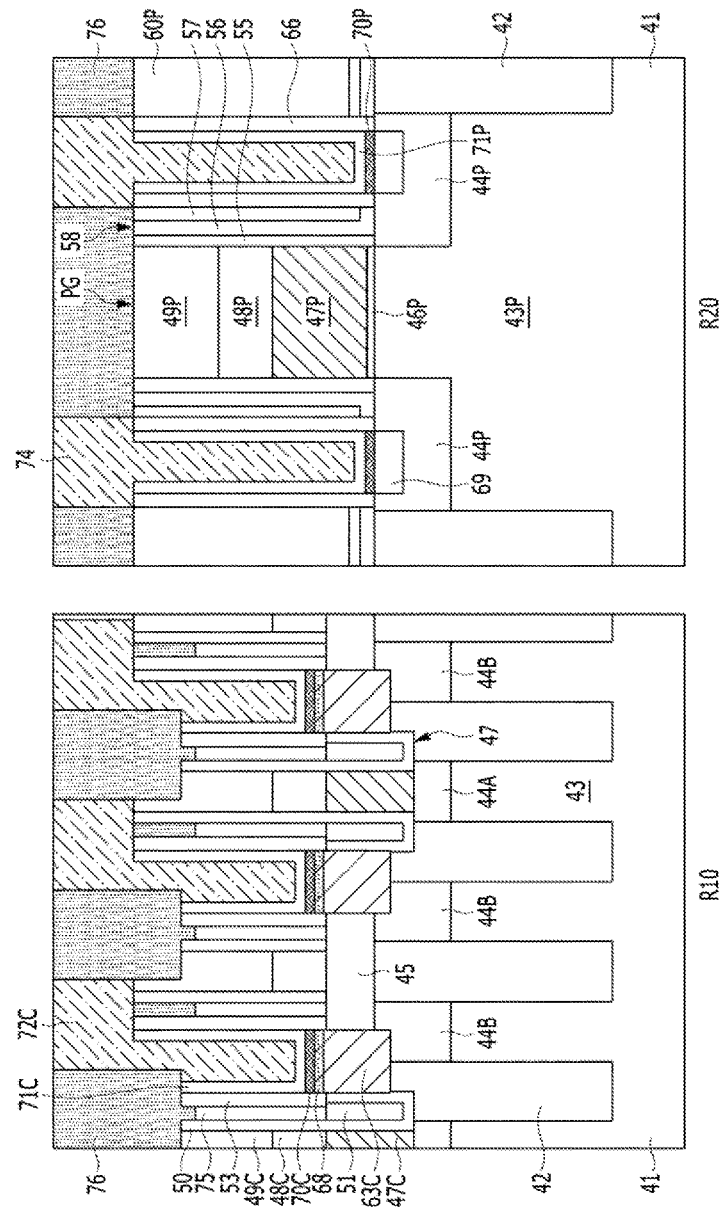

As shown in FIG. 9C, an air capping layer 76 may be formed. The air gaps 75 may be sealed by the air capping layer 76. The air capping layer 76 may be planarized such that the surfaces of the first metal plugs 72C are exposed.

Figure 9D:
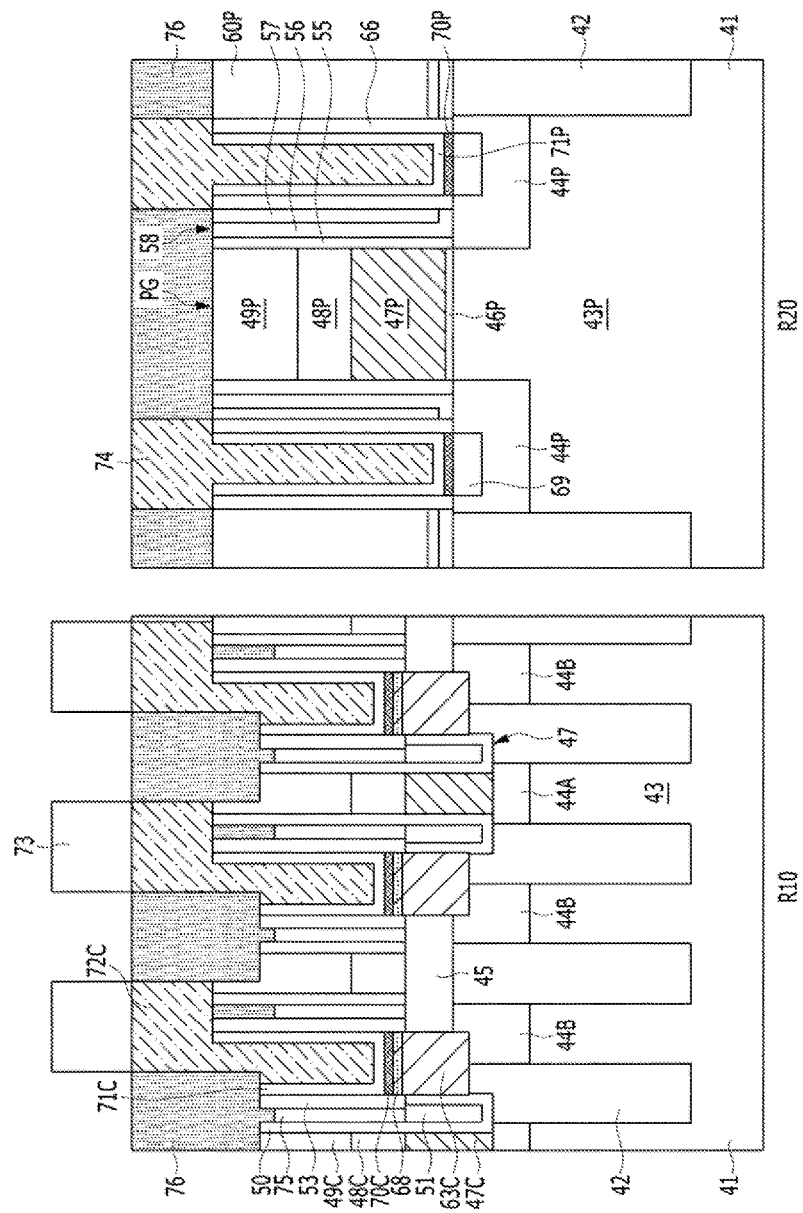

As shown in FIG. 9D, memory elements 73 may be formed on the first metal plugs 72C.

The semiconductor structures according to the above-described embodiments may be applied to a DRAM (dynamic random access memory) and may also be applied to a memory such as an SRAM (static random access memory), a flash memory, an FeRAM (ferroelectric random access memory), an MRAM (magnetic random access memory) and a PRAM (phase change random access memory).

Although various embodiments have been described for illustrative purposes, it will be apparent to those skilled in the art that various changes and modifications may be made without departing from the spirit and scope of the invention: as defined in the following claims.

What is claimed is:

1. A method for manufacturing a semiconductor structure, comprising:
    preparing a substrate which includes a first doping region and a second doping region;
    forming a dielectric layer over the substrate;
    forming a first opening in the dielectric layer to exposes the first doping region;
    forming a silicon filler in the first opening;
    forming a mask layer to protect the silicon filler and the first opening;
    forming a second opening in the dielectric layer to exposes the second doping region, wherein the second opening is formed after the forming of the mask layer;
    forming a sidewall spacer over the sidewall of the second opening;
    recessing the silicon filler to form a silicon region, wherein the silicon region fills a lower portion of the first opening:
    forming a first metal-silicon region over the silicon region; and
    forming a second metal-silicon region over the second doping region.

2. The method according to claim 1, further comprising:
    forming a first metal region over the first metal-silicon region, and concurrently forming a second metal region over the second metal-silicon region.

3. The method according to claim 1, wherein the first opening has an aspect ratio larger than the second opening.

4. The method according to claim 1, wherein the first opening and the second opening have the same height, and wherein the first opening has a width smaller than the second opening.

5. The method according to claim 1, wherein the forming of the first metal-silicon region and the second metal-silicon region comprises:
    forming a metal layer over the silicon region and the second doping region;
    forming the first metal-silicon region by reacting the silicon region and the metal layer;
    forming the second metal-silicon region by reacting the second doping region and the metal layer; and
    removing a non-reacted metal layer.

6. The method according to claim 1, further comprising:
    Before the forming of the first metal-silicon region and the second metal-silicon region,
    forming a first interface doping region over the silicon region; and
    forming a second interface doping region over the second doping region.

7. The method according to claim 6,
    wherein the silicon region is formed of a doped polysilicon layer,
    wherein the first interface doping region has a doping concentration higher than the doped polysilicon layer, and
    wherein the forming of the first interface doping region comprises:
        doping an upper portion of the doped polysilicon layers to form the first interface doping region; and
        performing a thermal processing to activate a dopant in the first interface doping region.

8. The method according to claim 6,
wherein the second interface doping region has a doping concentration higher than the second doping region, and
wherein the forming of the second interface doping region comprises:
doping an upper portion of the second doping region to form the second interface doping region; and
performing a thermal processing to activate a dopant in the second interface doping region.

9. The method according to claim 1, wherein the first doping region comprises a source/drain region of a first transistor, and the second doping region comprises a source/drain region of a second transistor.

10. A method for manufacturing a semiconductor structure, comprising:
preparing a semiconductor substrate which includes a memory cell region and a peripheral circuit region;
forming a buried word line in the semiconductor substrate in the memory cell region;
forming a bit line structure over the semiconductor substrate in the memory cell region;
forming a dielectric layer over the semiconductor substrate in the peripheral circuit region and the bit line structure in the memory cell region;
forming a first opening in the dielectric layer in the memory cell region;
filling a silicon filler in the first opening;
forming a second opening in the dielectric layer in the peripheral circuit region;
forming a sidewall spacer over a sidewall of the second opening;
recessing the silicon filler to form a silicon plug, wherein the silicon plug fills a lower portion of the first opening; and
forming a first metal silicide over a top surface of the silicon plug, and concurrently forming a second metal silicide in a lower portion of the second opening,
wherein the forming of the second opening and the forming of the sidewall spacer comprises:
masking the memory cell region including the silicon filler;
forming the second opening by etching the dielectric layer in the peripheral circuit region;
forming a spacer layer to cover a sidewall and a bottom surface of the second opening; and
etching back the spacer layer to form the sidewall spacer over the sidewall of the second opening.

11. The method according to claim 10, further comprising:
forming a first metal plug and a second metal plug concurrently,
wherein the first metal plug fills the first opening and is provided over the first metal silicide, and
wherein the second metal plug fills the second opening and is provided over the second metal silicide.

12. The method according to claim 10, further comprising:
before the forming of the first metal silicide and the second metal silicide, doping a first dopant into the top surface of the silicon plug to form a first interface doping region.

13. The method according to claim 10, further comprising:
before the forming of the first metal silicide and the second metal silicide, doping a second dopant into the semiconductor substrate exposed by the second opening to form a second interface doping region.

14. The method according to claim 10, wherein the forming of the silicon plug comprises:
masking the peripheral circuit region including the second opening;
etching back the silicon filler and forming the silicon plug;
doping the top surface of the silicon plug with a dopant; and
performing a thermal processing to activate the dopant.

15. The method according to claim 10, wherein the forming of the dielectric layer over the semiconductor substrate in the peripheral circuit region and the bit line in memory cell region comprises:
forming a interlayer dielectric layer over the bit line in the memory cell region and the semiconductor substrate in peripheral circuit region;
planarizing the interlayer dielectric layer such that a top surface of the bit line structure is exposed;
forming plug isolation parts by partially etching portions of the interlayer dielectric layer;
forming a plug isolation layer in the plug isolation parts; and
removing the remaining interlayer dielectric layer from the memory cell region,
wherein the interlayer dielectric layer remains in the peripheral circuit region, and the plug isolation layer is formed in the memory cell region.

16. The method according to claim 10, further comprising:
forming a gate structure in the peripheral circuit region by using the same material as the bit line structure.

17. The method according to claim 16, further comprising:
forming a first spacer element over a sidewall of the bit line structure; and
forming a second spacer element over a sidewall of the gate structure.

18. The method according to claim 17, further comprising:
forming an air gap by removing a portion of the first spacer element; and
capping the air gap.

* * * * *